United States Patent
Hyun

[11] Patent Number: 6,144,374
[45] Date of Patent: Nov. 7, 2000

[54] APPARATUS FOR DRIVING A FLAT PANEL DISPLAY

[75] Inventor: Chang Ho Hyun, Kyungsanghuk-do, Rep. of Korea

[73] Assignee: Orion Electric Co., Ltd., Gumi-si, Rep. of Korea

[21] Appl. No.: 09/026,668

[22] Filed: Feb. 20, 1998

[30] Foreign Application Priority Data

| May 15, 1997 | [KR] | Rep. of Korea | 97-18728 |
| May 15, 1997 | [KR] | Rep. of Korea | 97-18729 |
| Sep. 30, 1997 | [KR] | Rep. of Korea | 97-50599 |

[51] Int. Cl.[7] .............. G09G 3/28; G09G 5/00; G09G 3/36; G11C 19/00; C05F 1/40
[52] U.S. Cl. .............. 345/204; 345/63; 345/147; 345/89; 345/98; 345/198; 345/99; 345/197; 345/100; 377/64; 323/273; 323/280; 327/103; 327/108
[58] Field of Search .............. 345/74, 75, 63, 345/97, 147, 204, 211, 205, 206, 197, 198, 89, 235; 377/64; 323/269, 273, 277, 280; 327/103, 108, 538

[56] References Cited

U.S. PATENT DOCUMENTS

| 4,538,145 | 8/1985 | Mitani et al. | 345/197 |
| 4,618,814 | 10/1986 | Kato et al. | 363/73 |
| 5,172,108 | 12/1992 | Wakabayashi et al. | 345/148 |
| 5,198,701 | 3/1993 | Davies et al. | 327/538 |
| 5,521,611 | 5/1996 | Okada et al. | 345/89 |
| 5,949,194 | 9/1999 | Kawakami et al. | 345/76 |

FOREIGN PATENT DOCUMENTS

| 58-208621 | 5/1983 | Japan | 327/103 |

*Primary Examiner*—Mark R. Powell
*Assistant Examiner*—Ryan Yang
*Attorney, Agent, or Firm*—Jacobson, Price, Holman & Stern, PLLC

[57] ABSTRACT

The present invention is to provide an apparatus for driving a flat panel display which allows the amount of electrons emitted from a cell to be easily controlled and which performs a stable display gradation processing. To this end, the present invention comprises a shift register for sequentially shifting a video signal input from the exterior in synchronism with a clock signal; a latch for temporarily storing and outputting said video signal which has been sequentially inputted from said shift register; an AND gate for adjusting the time of outputting said video signal output from said latch; and an output driving circuit for inputting said video signal from said AND gate and performing a display gradation control. The present invention allows the amount of electrons emitted from a cell to be easily adjusted so that a 16 step of gradation processing of a display is made possible.

3 Claims, 21 Drawing Sheets

APPARATUS FOR DRIVING A FLAT PANEL DISPLAY

BACKGROUND OF THE INVENTION

1. Field of the Invention

The present invention relates to an apparatus for driving a flat panel display, and more particularly, to an apparatus for driving a flat panel display which controls the amount of electrons emitted from a cell by controlling the output current of a cathode.

2. Description of the Related Art

Presently, liquid crystal displays are widely used as flat panel displays. The liquid crystal display makes an image by intermitting the light beam from a light source by using a liquid crystal. A driving scheme for the liquid crystal display includes a passive matrix addressing method and an active matrix addressing method.

The passive matrix addressing method applies different voltages to the upper and lower plates of a glass substrate of the liquid crystal display, and inputs data to a pixel at the intersection. With this method, pixels adjacent to the addressed pixel are affected from the applied voltages, and thus a compensating circuit is necessary to implement a clear display. As a result, the implementation of a driving circuit becomes complex.

The active matrix addressing method has one cell transistor and one capacitance per pixel. According to the active matrix addressing method, one pixel continues to be driven by the previous pixel data until the next pixel data is inputted. This method is aimed at improving the image quality and of making the driving circuit simple.

With the active matrix addressing method, improvement of image quality and simplification of the driving circuit can be achieved. A large number of transistors and capacitors, however, must be implanted on the glass substrate of the liquid crystal display. Thus, this method has drawbacks in that the manufacturing process is very complex and the yield of the process is lowered.

This liquid crystal display occupies a large amount of market share. Since only a small percentage of light from the light source contributes to a display, power consumption is high. Also, it is difficult to make a large scale display. Since a material of the quasi-liquid state (liquid crystal) is used, the display is sensitive to change in atmospheric temperature. It is also vulnerable to pressure. The screen of the display is not very bright, the resolution of the display is very limited, and thus there are few applications.

The field emission display has been proposed as the new flat panel display to overcome the afore-mentioned problems. The field emission display displays a screen in a way similar to how a cathode ray tube makes use of emitted electrons. The field emission display differs from the cathode ray tube in that the former uses a cold electron emission.

The field emission display disposes field emission devices which emit electrons for each pixel, and makes a displayed image by making the electrons from the field emission devices collide with electrodes coated with a fluorescent film.

The field emission display has been widely accepted as the next generation flat panel display which can solve the above-mentioned problems where: the power consumption is large, it is difficult to make a large scale display, the display is sensitive to change in atmospheric temperature, the display is vulnerable to pressure, the screen of the display is not very bright, and the resolution of the display is very limited, all of the above resulting only in a few applications.

The field emission display can integrate several hundreds to several thousands of electron emission devices to form a pixel. The electron emission device, which forms a pixel of the field emission display, comprises of cathode 52 which is connected to base electrode 50, gate electrode 54 disposed apart from and above cathode 52, anode 58 with its back side coated with fluorescent film 56 as shown in FIG. 1. Fluorescent film 56 allows an image to be displayed by generating a light corresponding to the amount of electrons which collide with the fluorescent film.

Anode 58 attracts the electrons emitted from cathode 52. Anode 58 is transparent so that the light of fluorescent film 56 can be transmitted. Cathode 52 has a shape of a cone which forms the upper part of a tip. Cathode 52 makes electrons emitted from its tip by means of a driving source from base electrode 50.

Gate electrode 54 induces the emission of electrons from cathode 52 by a high voltage which is lower than the voltage applied to anode 58. The emitted electrons are directed to anode 58 to which the high voltage has been applied.

All flat panel displays including the field emission display which is equipped with field emission devices, adopt a pulse width modulation (PWM) driving scheme and a pulse amplitude modulation (PAM) driving scheme. The PWM driving scheme modulates the width of the output pulse and controls the gradation of a display. The PWM driving scheme requires a high speed operating frequency and transistors have to be integrated per cell. Thus the manufacturing process is complex and the cost associated with manufacturing is increased. The PAM driving scheme modulates the level of the output voltage or current, and has a drawback where a separate circuit for dividing a voltage or a current is required.

U.S. Pat. No. 5,103,145 discloses a display gradation scheme wherein one pixel is divided by a cathode of 1:2:4:8. This scheme also has a drawback where the brightness is lowered due to the division of the cathode with respect to a limited number of pixels, and that the amount of current cannot be compensated for against the difference between cathodes due to different cathode manufacturing processes.

SUMMARY OF THE INVENTION

It is therefore an object of the present invention to provide an apparatus for driving a flat panel display which allows the amount of electrons emitted from a cell to be easily controlled and which performs a stable display gradation processing.

It is another object of the present invention to provide an apparatus for driving a flat panel display which improves the processing speed by processing data in parallel, reduces the speed of an input clock, makes a constant current supplied to a display panel irrespective of the voltage applied to the cathode by allowing for the change of the current according to the input signal at the final stage, and synchronizes with an address signal by using a data carry which is a data control signal.

In accordance with the first embodiment of the present invention to achieve the aforementioned objects, an apparatus for driving a flat panel display is provided which comprises a shift register for sequentially shifting a video signal input from the exterior in synchronism with a clock signal; a latch for temporarily storing and outputting said video signal which has been sequentially input from said shift register; an AND gate for adjusting the time of outputting said video signal output from said latch; and an output driving circuit for inputting said video signal from said AND gate and performing a display gradation control.

In accordance with the second embodiment of the present invention to achieve the aforementioned objects, an apparatus for driving a flat panel display is provided which comprises a shift register for sequentially shifting data which was input from the exterior in a synchronized manner; a plurality of latches for performing parallel processing on input data by latching the input data by using the signal output from said shift register as a synchronization signal; an AND gate for outputting the signal output through said plurality of latches on a bit by bit basis; and an output driving circuit for enabling display gradation processing by controlling the amount of currents in accordance with the signal output from said AND gate.

BRIEF DESCRIPTION OF THE DRAWINGS

The present invention will become more apparent upon a detailed description of the preferred embodiments for carrying out the invention as rendered below. In the description to follow, references will be made to the accompanying drawings, where like reference numerals are used to identify like or similar elements in the various drawings and in which.

DETAILED DESCRIPTION OF THE PREFERRED EMBODIMENTS

Figure 1:
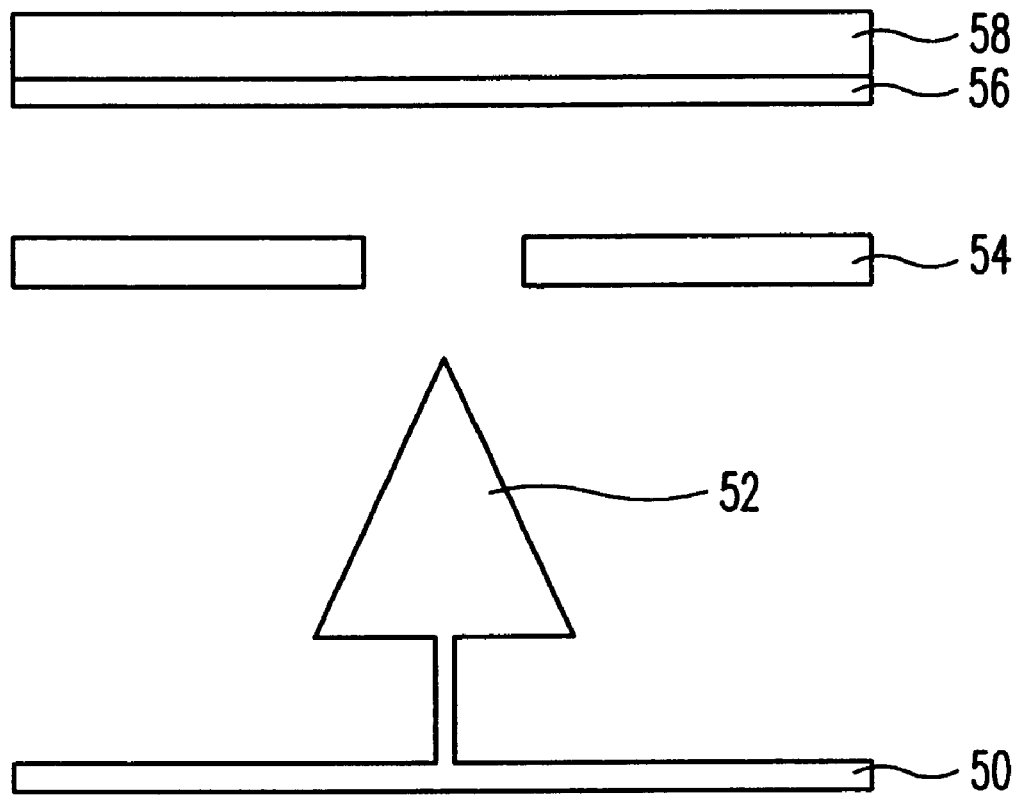
FIG. 1 is a view which explains the structure of a conventional field emission device.
Figure 2:
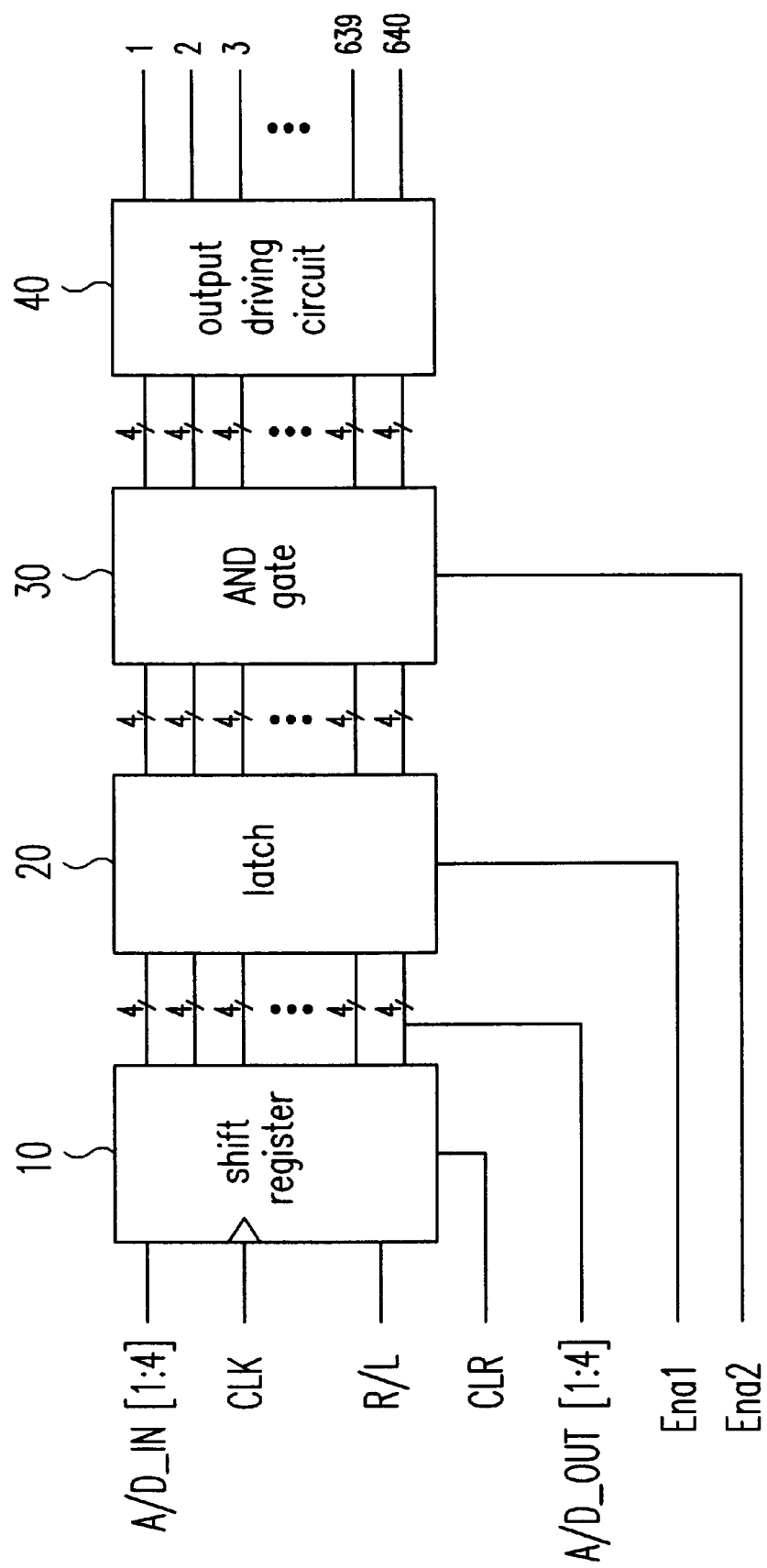
FIG. 2 is a block diagram showing the structure of an apparatus for driving a flat panel display in accordance with a first embodiment of the present invention.
Figure 3:
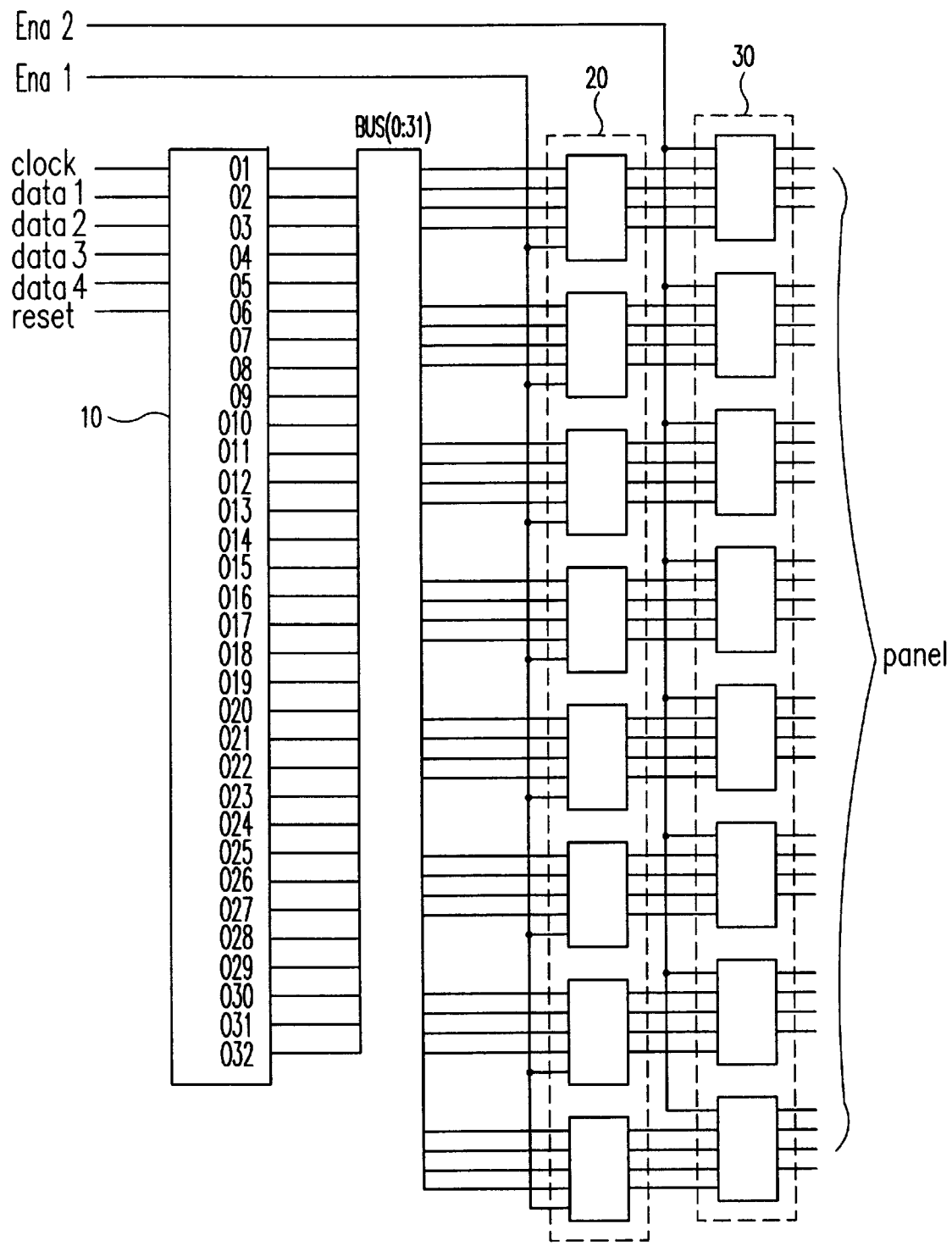
FIG. 3 is a diagram showing the detailed connection between blocks in FIG. 2.

FIG. 2 is a block diagram showing the structure of an apparatus for driving a flat panel display in accordance with the first embodiment of the present invention. FIG. 3 is a diagram showing the detailed connection between blocks in FIG. 2. Each part adopted in an embodiment of the present invention has been designed to have a 4-bit structure for a display gradation processing of 16 steps.

In FIGS. 2 and 3, A/D_IN[1:4] is an input terminal for receiving a 4-bit data input signal. A/D_OUT[1:4] is an output terminal for outputting a final output signal. CLK is a clock input terminal for synchronizing with A/D_IN[1:4]. Ena1 is an input signal control terminal for storing data from a shift register 10 into latch 20. Ena2 is a synchronization signal control terminal for controlling the time of outputting input data stored in latch 20 to a final stage circuit (output driving circuit 40).

Shift register 10 sequentially shifts the 4-bit video signal (A/D_IN[1:4]) input from the exterior in synchronism with a clock (CLK). In an embodiment of the present invention, a synchronization of data (A/D_IN[1:4]) with the CLK is generated at the rising time of the CLK. Shift register 10 comprises n multiplexers 11, 12, 13, . . . n and n 4-bit D flip-flops 15, 16, 17, . . . kn. The first multiplexer 11 is a two input/one output device which outputs one of the 4-bit external input video signal (A/D_IN[1:4]) and the output signal of the second D flip-flop 16 according to an up/down count instruction signal (R/L). At the output stage of the first multiplexer 11, the first D flip-flop 15 comprising 4 D flip-flops 15a–15d is connected to output the signal of the corresponding output stage (Q1[1:4]).

The first D flip-flop 15 has data input stages A/D_IN1, A/D_IN2, A/D_IN3, A/D_IN4, output stages Q1, Q2, Q3, Q4, and 4 D flip-flops 15a, 15b, 15c, 15d which are connected in parallel and share a clock signal stage CLK and a clear signal stage CLR. The second multiplexer 12 receives the output signal (Q1[1:4]) of first D flip-flop 15 and the output signal (Q3[1:4]) of third D flip-flop 17, and outputs one of these signals in accordance with the up/down count instruction signal (R/L). At the output stage of second multiplexer 12, second D flip-flop 16 which is constructed in the same way as the internal structure of first D flip-flop 15 is connected to output the signal of the corresponding output stage (Q2[1:4]). Third multiplexer 13 and third D flip-flop 17 are interconnected in the same fashion.

4-bit shift register 10 performs a shifting operation in such a way that the output signal (Q1[1:4]) of first D flip-flop 15 is applied to second multiplexer 12 and the output signal (Q2[1:4]) of second D flip-flop 16 moves to third multiplexer 13 when the up/down count instruction signal (R/L) is at a high level. 4-bit shift register 10 performs a shifting operation in such a way that the signal of the nth multiplexer is applied through the nth D flip-flop kn to the previous multiplexer (third multiplexer 13), and the signal of third multiplexer 13 moves to second multiplexer 12 when the up/down count instruction signal (R/L) is at a low level.

Figure 5:
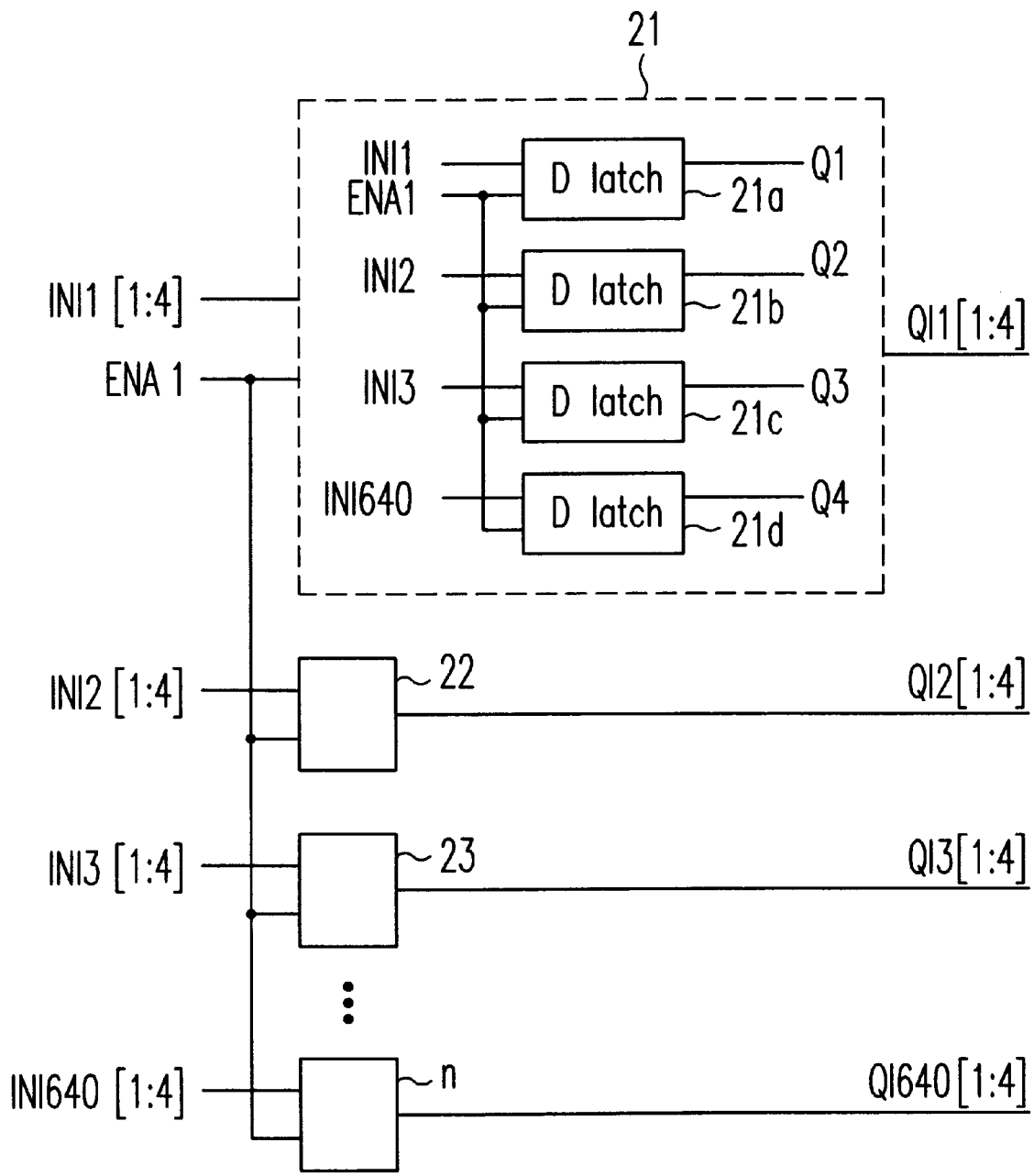
FIG. 5 is a view showing the internal structure of a latch shown in FIG. 2.

In FIG. 2, latch 20 temporarily stores data input from shift register 10 in accordance with the first enable control signal Ena1. Latch 20 comprises n D-type latches 21-n as shown in FIG. 5. Each of the latches 21-n shares the first enable control signal Ena1, receives one of input signals INI1[1:4], INI2[1:4], . . . , and outputs one of output signals QI1[1:4], QI2[1:4], . . . . In an embodiment of the present invention, the input is synchronized with the rising time of the first enable control signal Ena1 so that data latching is performed at the time of synchronization.

D latch 21 comprises 4 D latches 21a, 21b, 21c, 21d which share the first enable control signal, Ena1, receive one of input signals INI1, INI2, INI3, INI4, and output one of output signals Q1, Q2, Q3, Q4. The other latches are constituted in the same way as latch 21.

In FIG. 2, AND gate 30 adjusts the time of outputting a video signal input to the output driving circuit 40 from latch 20 (i.e., an output time during the time of scanning a gate). AND gate 30 comprises n 40 bit AND gates 31-n which share second enable control signal Ena2, receive one of input signals INII1[1:4], INII2[1:4], . . . , and output one of output signals QII1[1:4], QII2[1:4], . . . as shown in FIG. 6.

Figure 6:
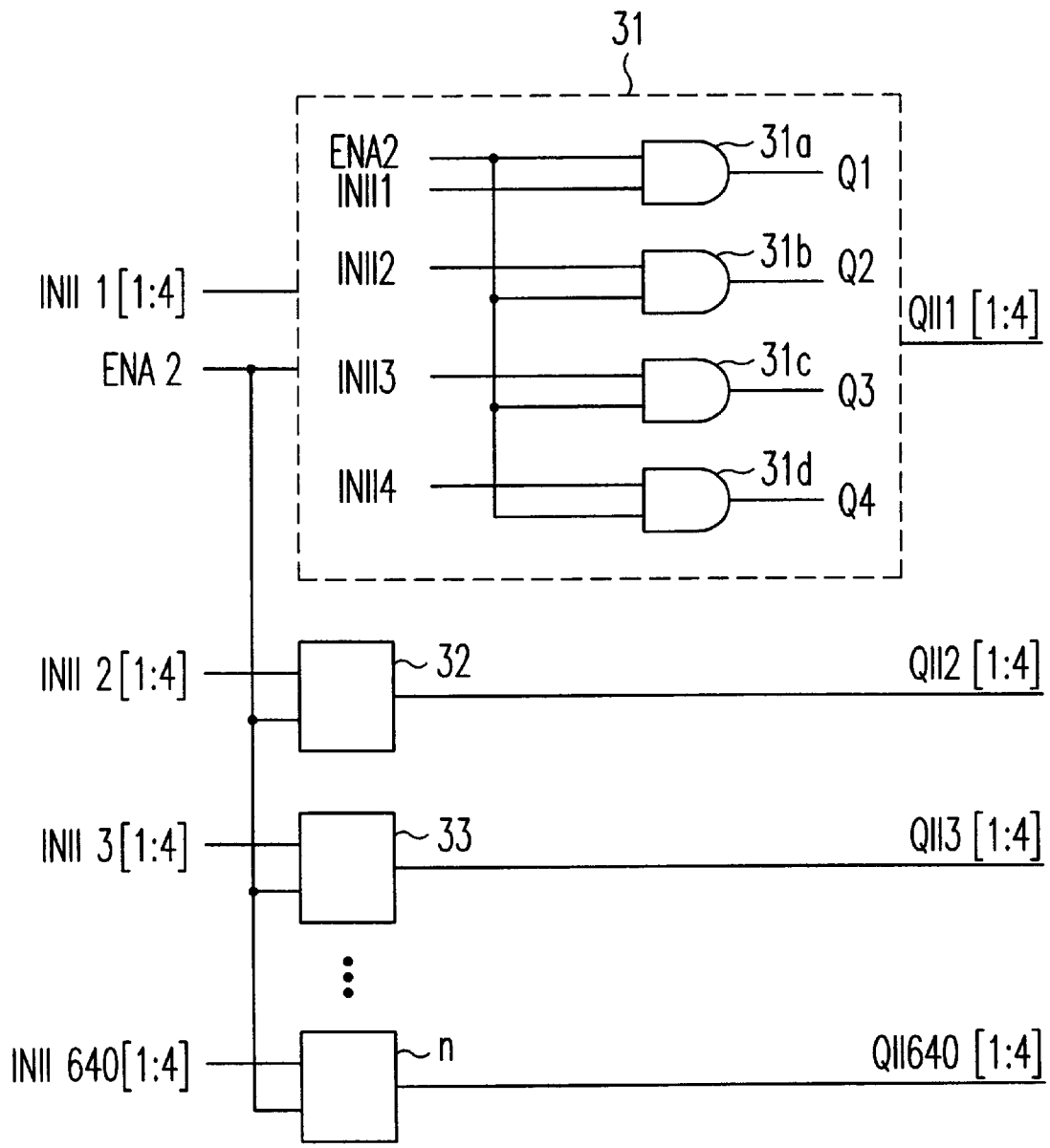
FIG. 6 is a view showing the internal structure of an AND gate shown in FIG. 2.

AND gate 31 comprises n AND gates 31a, 31b, 31c, 31d which share the second enable control signal Ena2, receive one of input signals INII1[1:4], INII2 [1:4], INII3[1:4], INII4[1:4] and output one of output signals Q1, Q2, Q3, Q4 as shown in FIG. 6. The other AND gates are constituted in the same way as AND gate 31.

Figure 7:
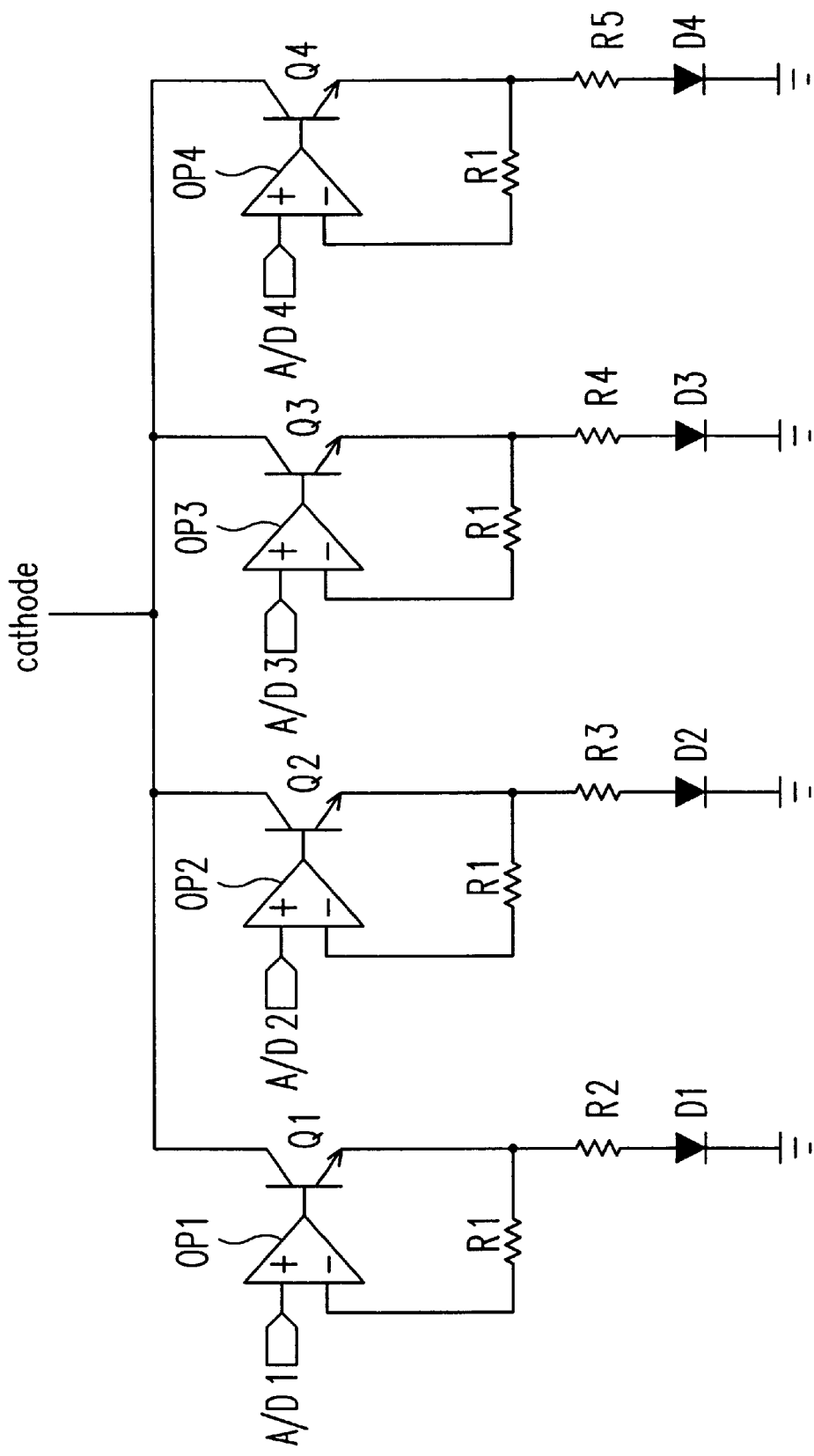
FIG. 7 is a view showing the internal structure of an output driving circuit shown in FIG. 2.

In FIG. 2, output driving circuit 40 converts a digital video signal output from AND gate 30 into an analog signal. In an embodiment of the present invention which uses a current control method, the input digital video signal is converted into an analog signal which is proportional to the amount of currents, and is transferred to a pixel so that a display gradation processing is performed. Output driving circuit 40 comprises of NPN transistors Q1, Q2, Q3, Q4 connected between the lower end of a cathode and the ground, operational amplifiers OP1, OP2, OP3, OP4 each connected to a respective one of said plurality of NPN transistors Q1, Q2, Q3, Q4 for switching a corresponding transistor, and resistors R2, R3, R4, R5 as a current limiting device connected between each transistor and the ground, as shown in FIG. 7.

The ratio of the resistors R1, R2, R3, R4 is 1:2:4:8, and the ratio of the currents I2, I3, I4, I5 is 8:4:2:1. The currents of 16 steps are made according to the 4-bit digital video signal input to the operational amplifiers OP1, OP2, OP3, OP4. In the structure of output driving circuit 40, the operational amplifiers OP1, OP2, OP3, OP4 serve as a voltage follower, and adjust the amount of currents from the emitter of the corresponding transistor Q1, Q2, Q3, Q4 in accordance with a non-inverted input voltage (i.e., A/D1, A/D2, A/D3, A/D4). In other words, output driving circuit 40 controls the amount of current caused by the change in voltage. Thus, the current of the cathode is controlled by input data A/D1, A/D2, A/D3, A/D4 of a voltage component, and resistors R2, R3, R4, R5.

Figure 4:
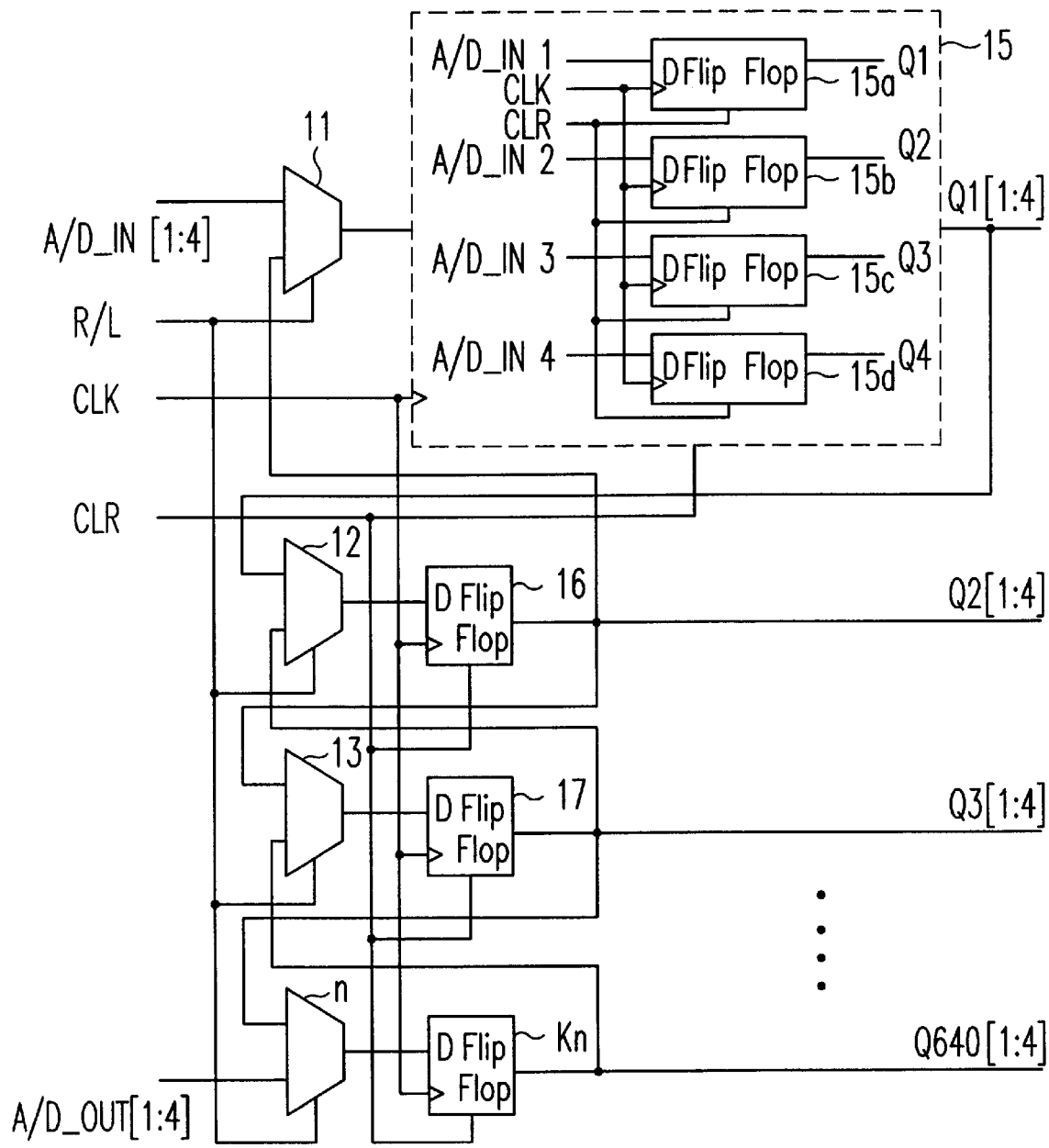
FIG. 4 is a view showing the internal structure of a shift register shown in FIG. 2.
Figure 8:
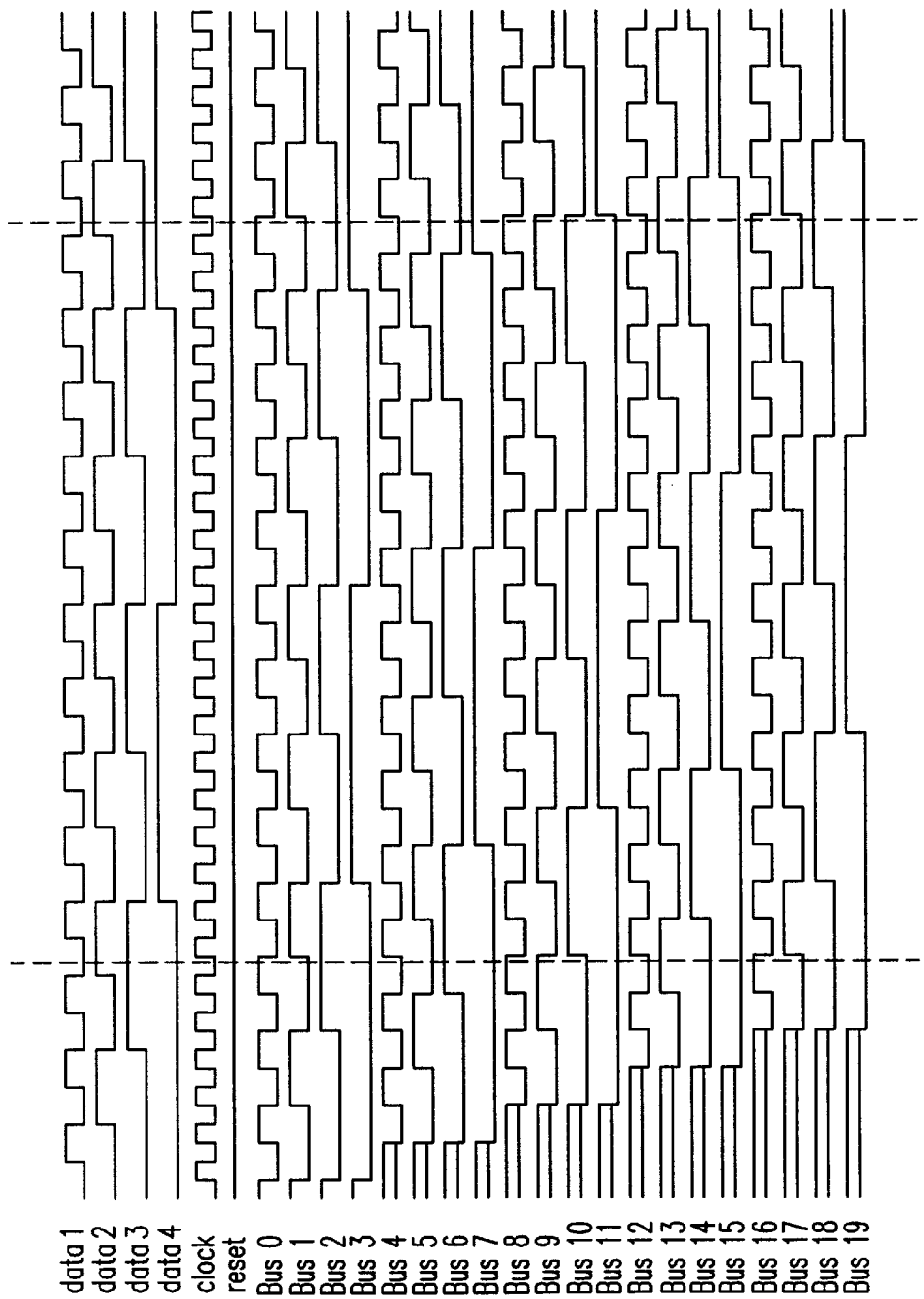
FIG. 8 is a diagram showing input/output simulation waveforms of a shift register shown in FIG. 4.

FIG. 8 is a diagram showing input/output simulation waveforms of a shift register shown in FIG. 4. The clock is a clock for data synchronization. The reset signal is a clear signal for data initialization. BUS0–BUS3 are output waveforms of the first shift resistor. BUS4–BUS7 are output waveforms of the second shift resistor. BUS8–BUS11 are output waveforms of the third shift resistor. BUS12–BUS15 are output waveforms of the fourth shift resistor. BUS16–BUS19 are output waveforms of the fifth shift resistor.

The reset signal is maintained at a high level. The clock signal is approximately a 4 MHz clock. When data "0000", "0001", "0010", . . . , "1111" are sequentially input, Q1[BUS0, BUS1, BUS2, BUS3], Q2[BUS4, BUS5, BUS6, BUS7], Q3[BUS8, BUS9, BUS10, BUS11], Q4[BUS12, BUS13, BUS14, BUS15], Q5[BUS16, BUS17, BUS18, BUS19] sequentially output data in synchronism with data 1, data 2, data 3, data 4 at the rising edge of the clock. Also, the waveform is transferred in the order of BUS0→BUS4→BUS8→BUS12→BUS16→BUS20 in synchronism with data 1 (A/D1) at the rising edge of the clock.

Figure 9:
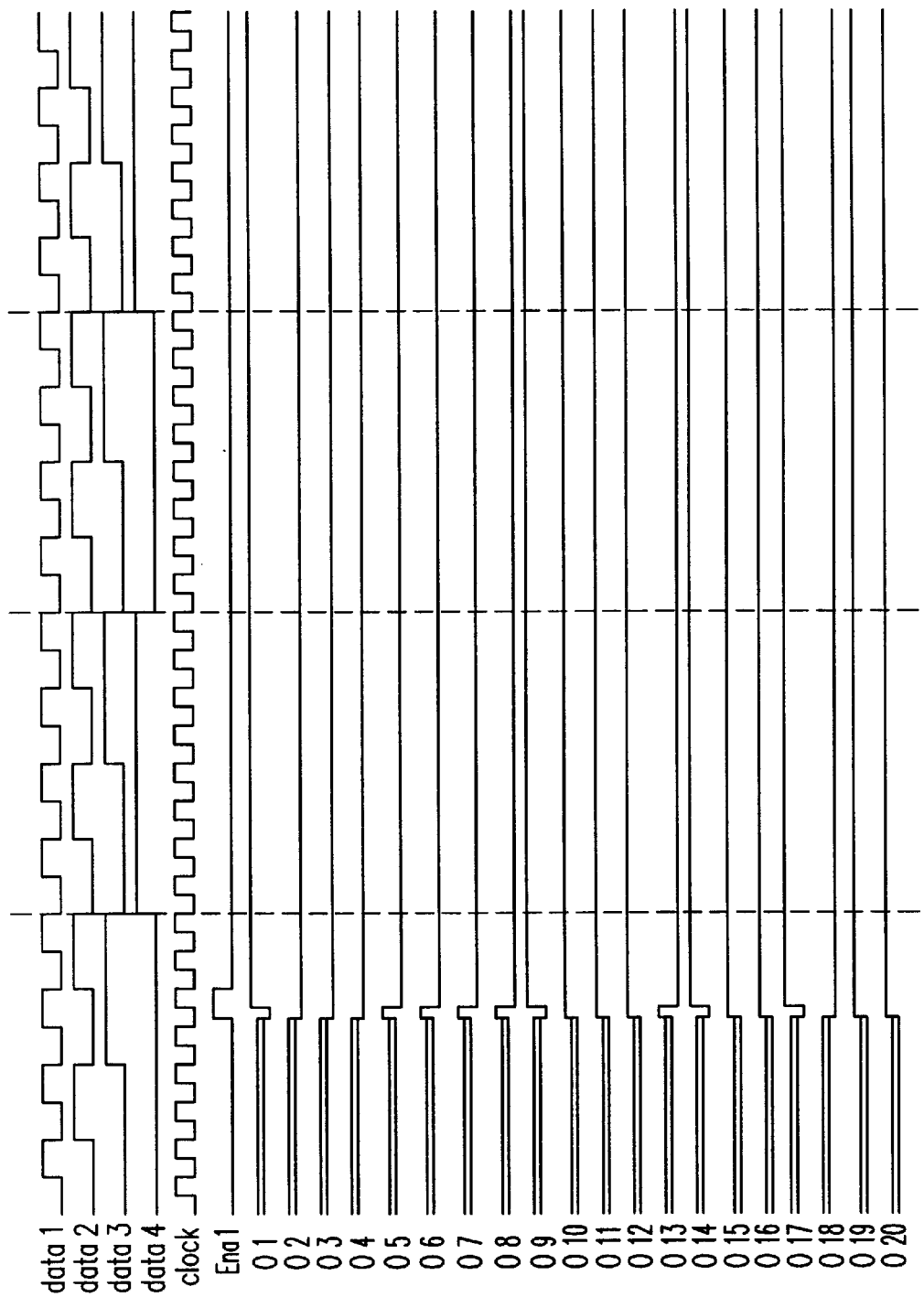
FIG. 9 is a diagram showing input/output simulation waveforms of a latch shown in FIG. 5.

FIG. 9 is a diagram showing input/output simulation waveforms of a latch shown in FIG. 5. The clock is a clock for data synchronization. Ena1 is a latch signal. O1–O4 are the waveforms of the first stage latch. O5–O8 are the waveforms of the second stage latch. O9–O12 are the waveforms of the third stage latch. O13–O16 are the waveforms of the fourth stage latch. O17–O20 are the waveforms of the fifth stage latch.

Figure 10:
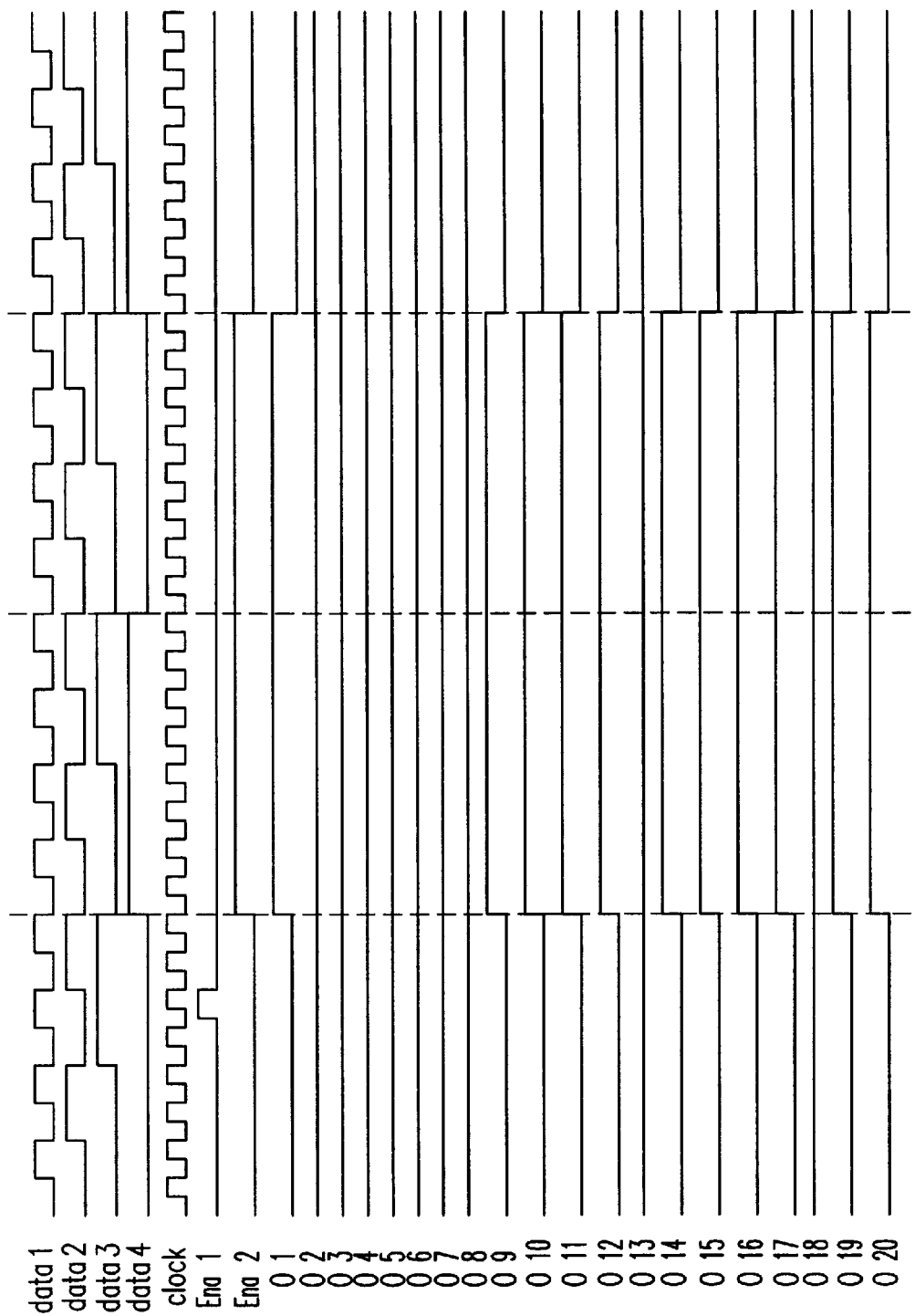
FIG. 10 is a diagram showing input/output simulation waveforms of an AND gate shown in FIG. 6.

FIG. 10 is a diagram showing input/output simulation waveforms of an AND gate shown in FIG. 6. Data 1-data 4 represent a data input signal sequentially inputted into the 4-bit shift resistor. The clock represents a signal for data synchronization. Ena1 is an input signal for storing a data signal at the 4-bit latch.

Data INI1[1:4] among data (i.e., INI1[1:4]–INI5[1:4]) input to the AND gate 30 is "0101". Data INI1[1:4], data INI2[1:4], data INI3[1:4], data INI4[1:4], and data INI5[1:4] accept "0101", "0100", "0011", "0010", "0001", which are the outputs of the 4-bit latch, as data. Data INI1[1:4], data INI2[1:4], data INI3[1:4], data INI4[1:4], and data INI5[1:4] maintain a high level state from 2 μs to 6 μs based on the second enable control signal Ena2, and adjust the output time when they are transferred to the final stage.

The output waveforms transferred to the final stage represent QII1[1:4] (Q1, Q2, Q3, Q4), QII2[1:4] (Q5, Q6, Q7, Q8), QII3[1:4] (Q9, Q10, Q11, Q12), QII4[1:4] (Q13, Q14, Q15, Q16), QII5[1:4] (Q17, Q18, Q19, Q20), and maintain data signals transferred from the 4-bit latch, i.e., "0101", "0100", "0011", "0010", "0001".

Figure 11A:
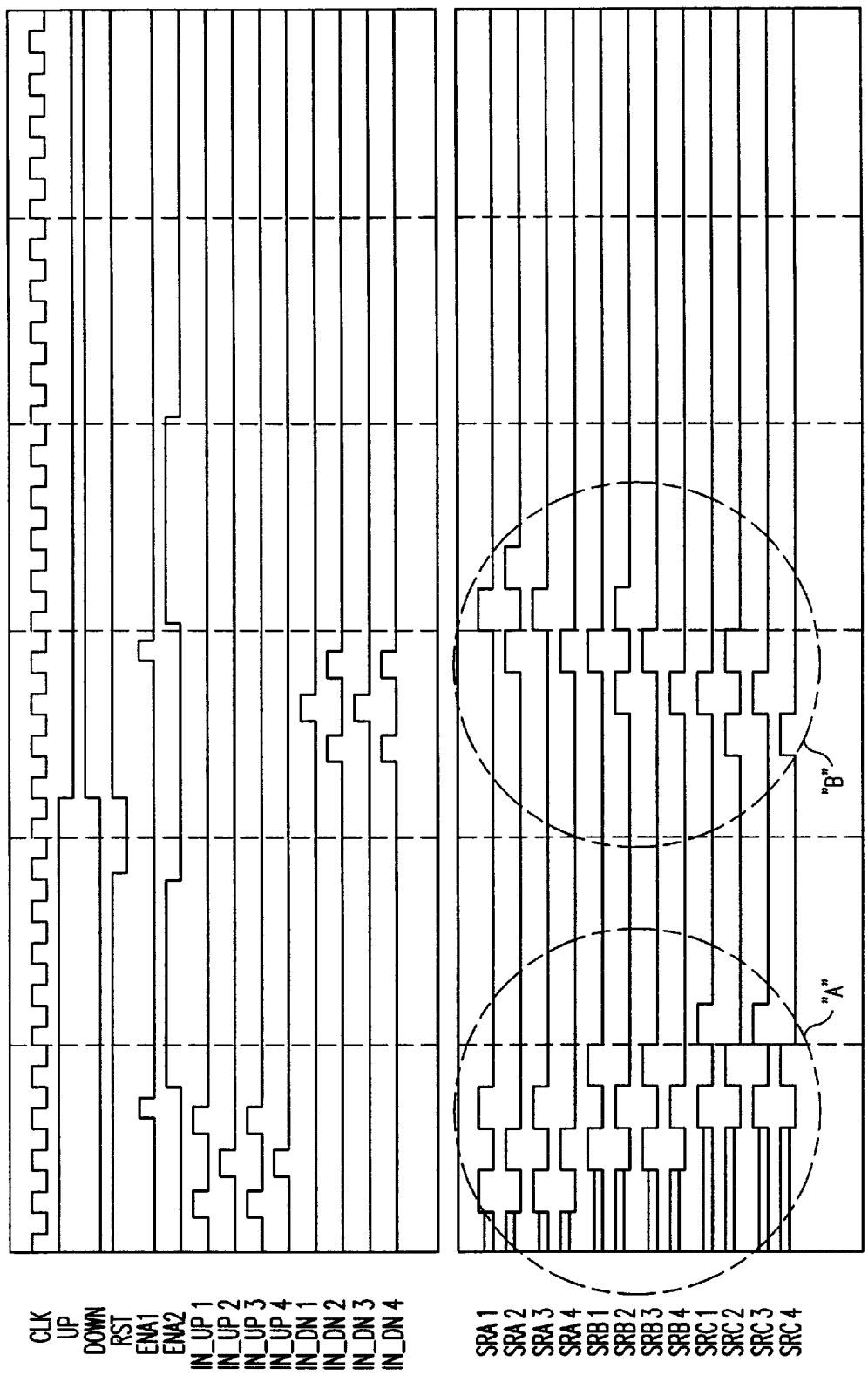
FIGS. 11a and 11b are diagrams showing input/output simulation waveforms of parts adopted for explaining an operation of an apparatus for driving a flat panel display in accordance with the first embodiment of the present invention.
Figure 11B:
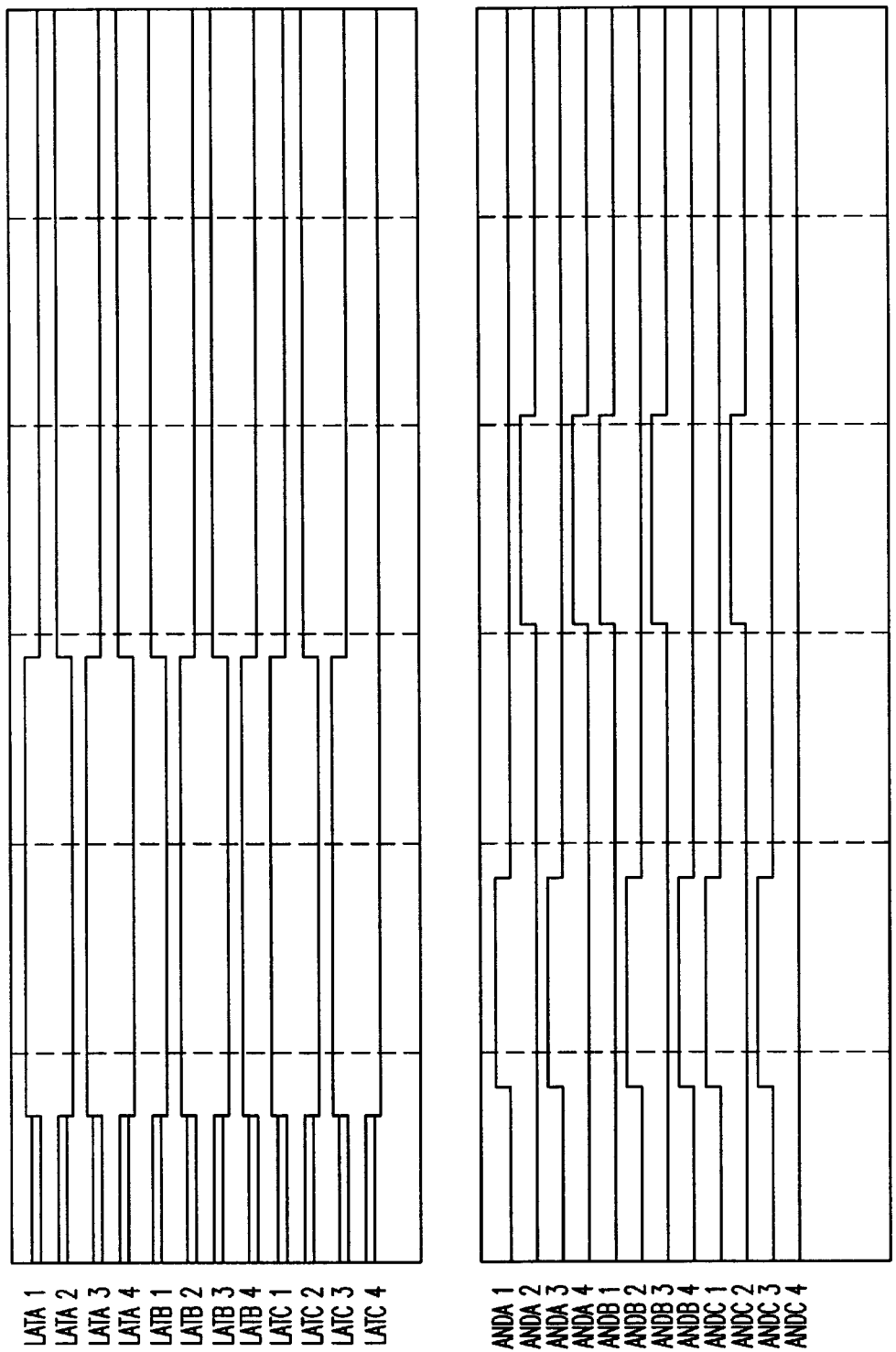

The operations of the apparatus for driving a flat panel display in accordance with the first embodiment of the present invention will now be described with reference to the simulation diagrams as shown in FIGS. 11a, 11b.

FIGS. 11a and 11b are diagrams showing input/output simulation waveforms of outputs for three stages by using a 20 MHz clock (CLK). In the shift register, input data A/D$_{13}$ IN[1:4] and the data clock, CLK, are synchronized at the rising edge to output data SRA1–SRA4 sequentially in response to the up/down count instruction signal R/L, e.g., a shifting operation is performed in the order of IN_UP1, IN_UP2, IN_UP3, and IN_UP4 as the up/down count instruction signal R/L becomes high to output corresponding data SRA1–SRA4 in a circle A of FIG. 11a, and a shifting operation is performed in the order of IN_DN1, IN_DN2, IN_DN3, and IN_DN4 as up/down count instruction signal R/L becomes low to output corresponding data SRA1–SRA4 in the circle of FIG. 11a.

Additionally, the output data of the shift register 10 is input to latch 20 which temporarily stores the data received from shift register 10 and outputs it to AND gate 30 according to the first enable control signal, Ena1.

AND gate 30 receives the output signal LATA1–LATC4 (FIG. 11b) of latch 20 and the second enable control signal, Ena2 as its input and outputs the result ANDA1–ANDC4 (FIG. 11b) to output driving circuit 40. Then, output driving circuit 40 converts the present digital video signal to an analog signal which is proportional to the current to transmit the analog signal to pixels. At this time, if the register ratio is R2:R3:R4:R5=1:2:4:8 and the current is measured at the output of output driving circuit 40, the current which flows to the cathode is increased by 10 uA as the bit number is increased by one, thereby a 10 level gradation is performed.

Figure 12:
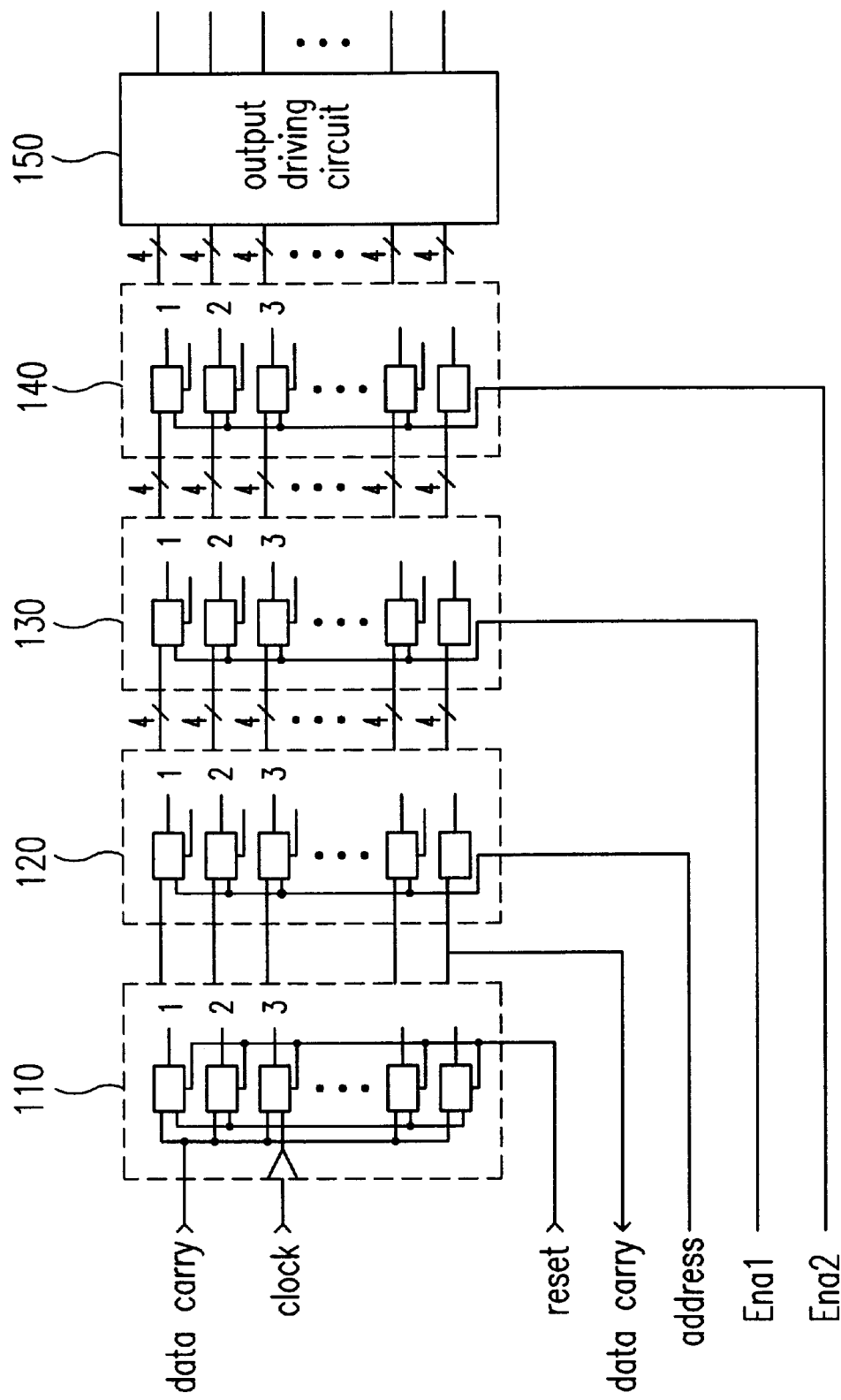
FIG. 12 shows a schematic block diagram of the structure of an apparatus for driving a flat panel display in accordance with a second embodiment of the present invention.

FIG. 12 is a block diagram illustrating a driving apparatus for the flat panel display in accordance with the second embodiment of the present invention. The driving apparatus of FIG. 12 comprises of shift register 110 for synchronizing the data control signal input from the controller with the clock and for sequentially shifting the synchronized signal; latches 120 and 130 for latching the signal output from shift register 110 with the data A/D1:A/D4 by using synchronization signals to perform parallel operations; AND gate 140 for receiving the output signals from latches 120 and 130 to output 4-bit signals; and output driving circuit 150 for performing image gradation by adjusting currents according to the input signal from AND gate 140.

Latch 120 synchronizes the sequential input data with the data control signals output from shift registers 110 and stores the results. Latch 120 serves as memory by synchronizing the signals stored in them with the enable signal, ENA1, and temporarily stores image signals for one line.

Shift register 110 has data carry signals and clock signals as its inputs and shift signals and data carry signals as its outputs. The data carry signals are output to an overall FED controller (not shown) after the shifting operation to be used as detecting signal for detecting whether the shifting of the input data is performed correctly without error. Also, latch 130 is used for simultaneously displaying the image signals of one line to be displayed, and AND gate 140 is used for synchronization of latch 130 and output driving circuit 150.

Figure 13:
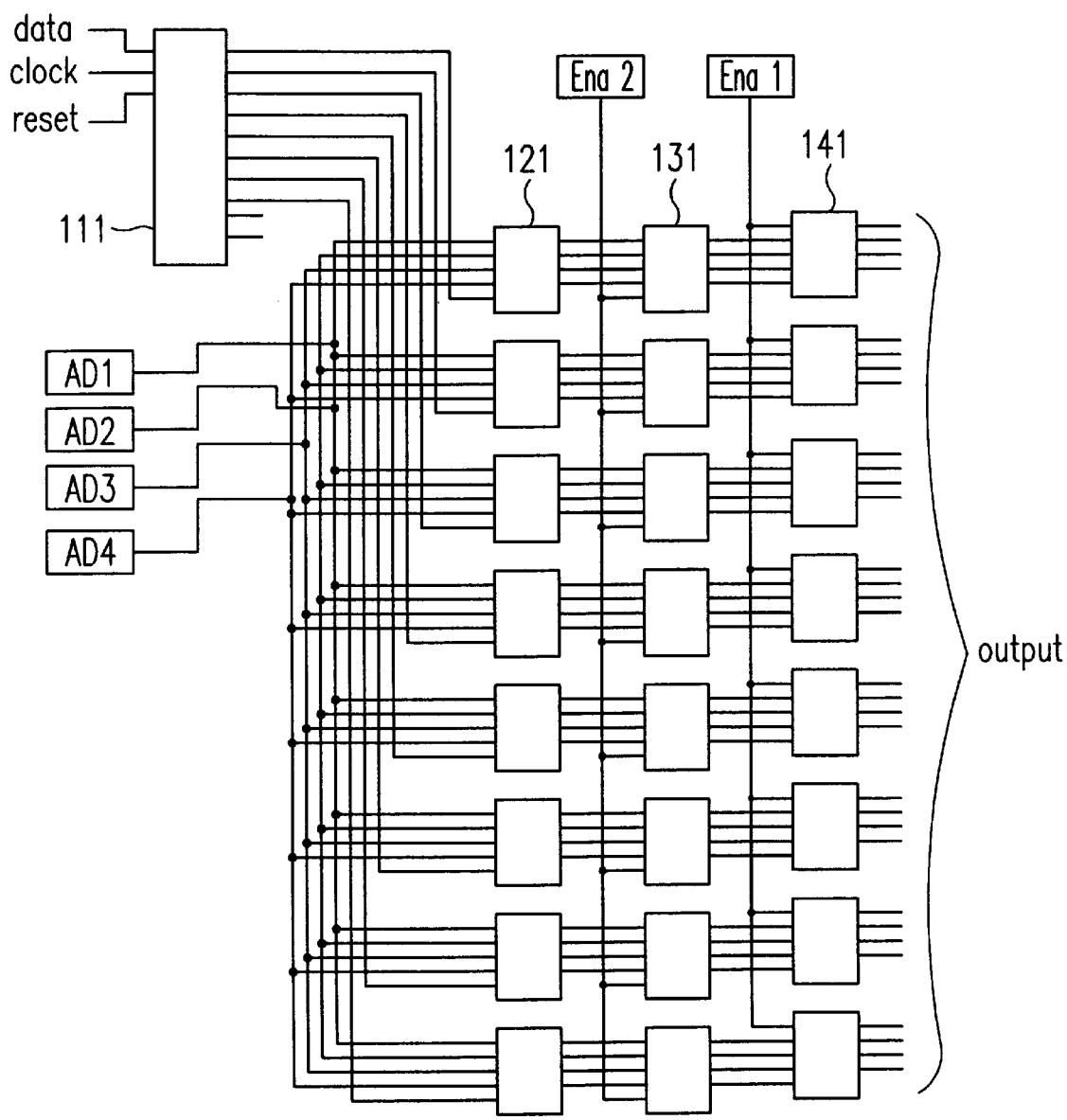
FIG. 13 is a detailed circuit diagram for blocks shown in FIG. 12.

FIG. 13 is a circuit diagram illustrating a detailed view of a portion of each block of FIG. 12. The circuit of FIG. 13 comprises of shift register 111 for shifting the 80 stage data to output the results; latches 121 and 131 for latching the sequential output data from shift register 111 to 4-bit data; 4-bit AND gate 141 for receiving the data output from latches 121 and 131 and outputting the results to output driving circuit 150 in 4-bit format.

Latches 121 and 131 each output the data in accordance with the active state of the enable signal input to the next stage, first latch 121 stores the data at second latch 131 according to the active state of first enable signal Ena1 which is received by second latch 131, and second latch 131 output the data to 4-bit gate 141 according to the active state of second enable signal Ena2 which is received by 4-bit gates 141.

Figure 14:
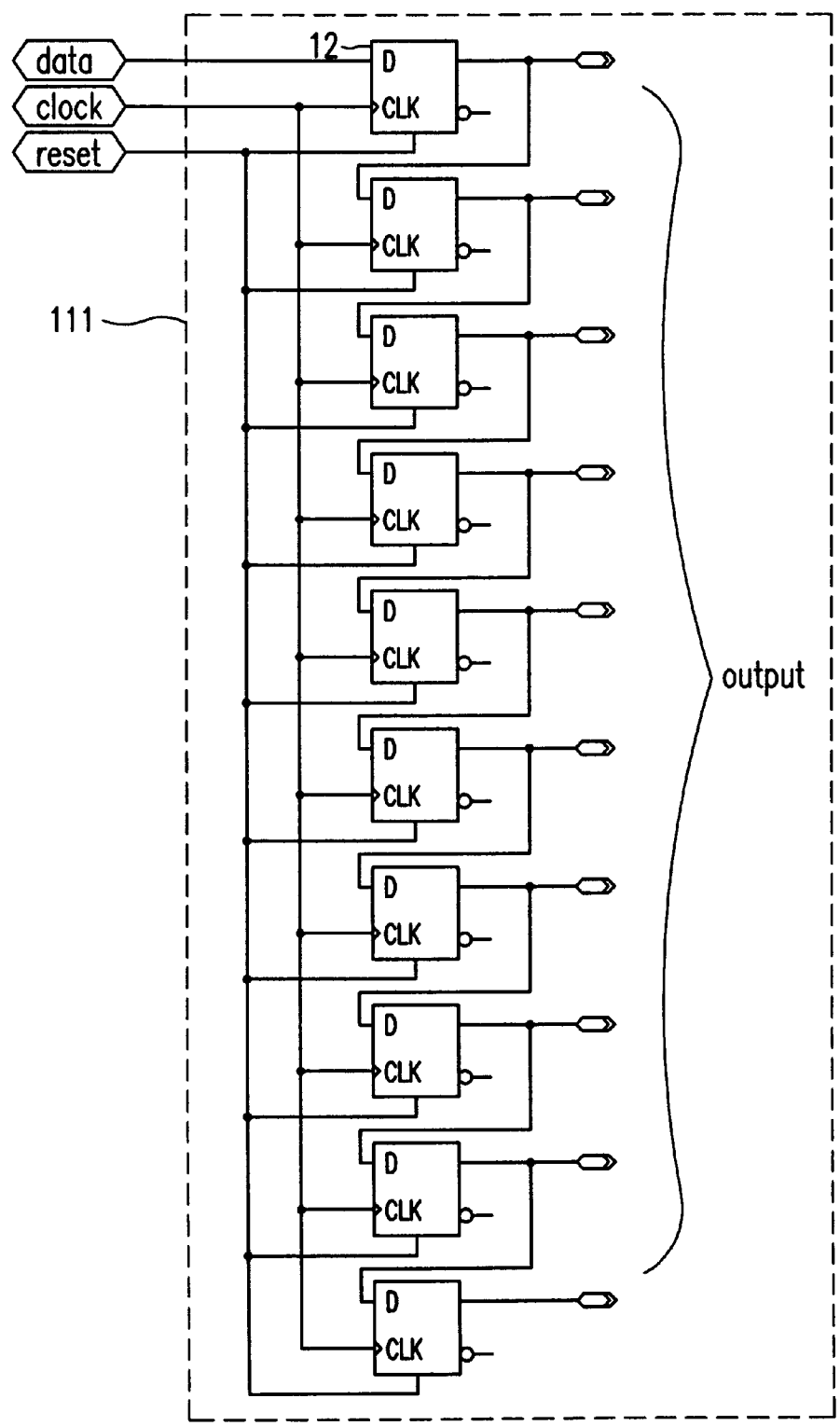
FIG. 14 is a detailed circuit diagram for the shift register shown in FIG. 13.
Figure 15:
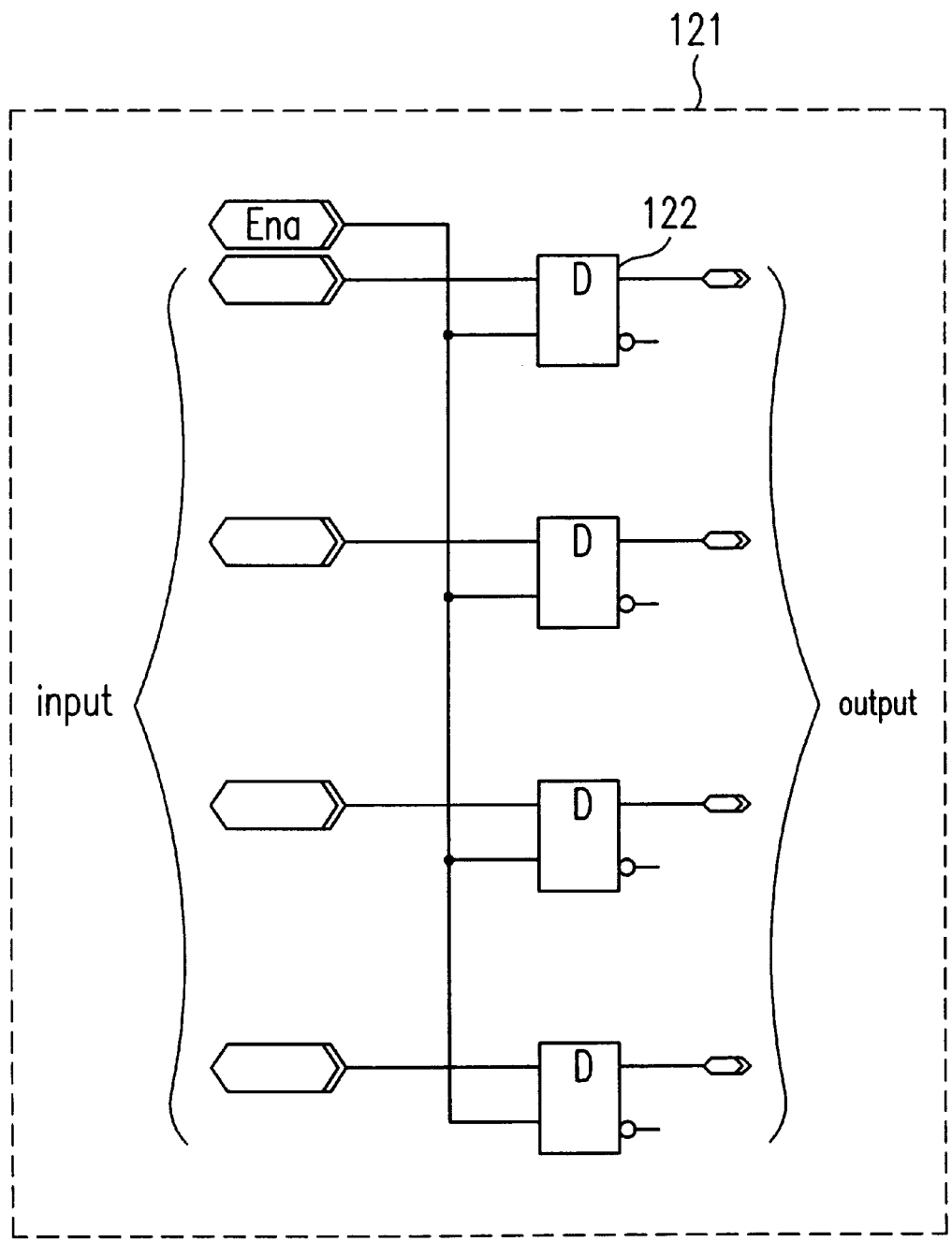
FIG. 15 is a detailed circuit diagram for the latch shown in FIG. 13.

As shown in FIG. 14, shift register 111 comprises a plurality of D flip-flops 112 which outputs the control data received from the controller in order to shift data. B latch 121 and latch 131, as shown in FIG. 15, comprises 4 D flip-flops which have their sync inputs connected to each other to simultaneously output data. Thus, the input signals are processed in parallel thereby reducing the input clock rates.

Figure 16:
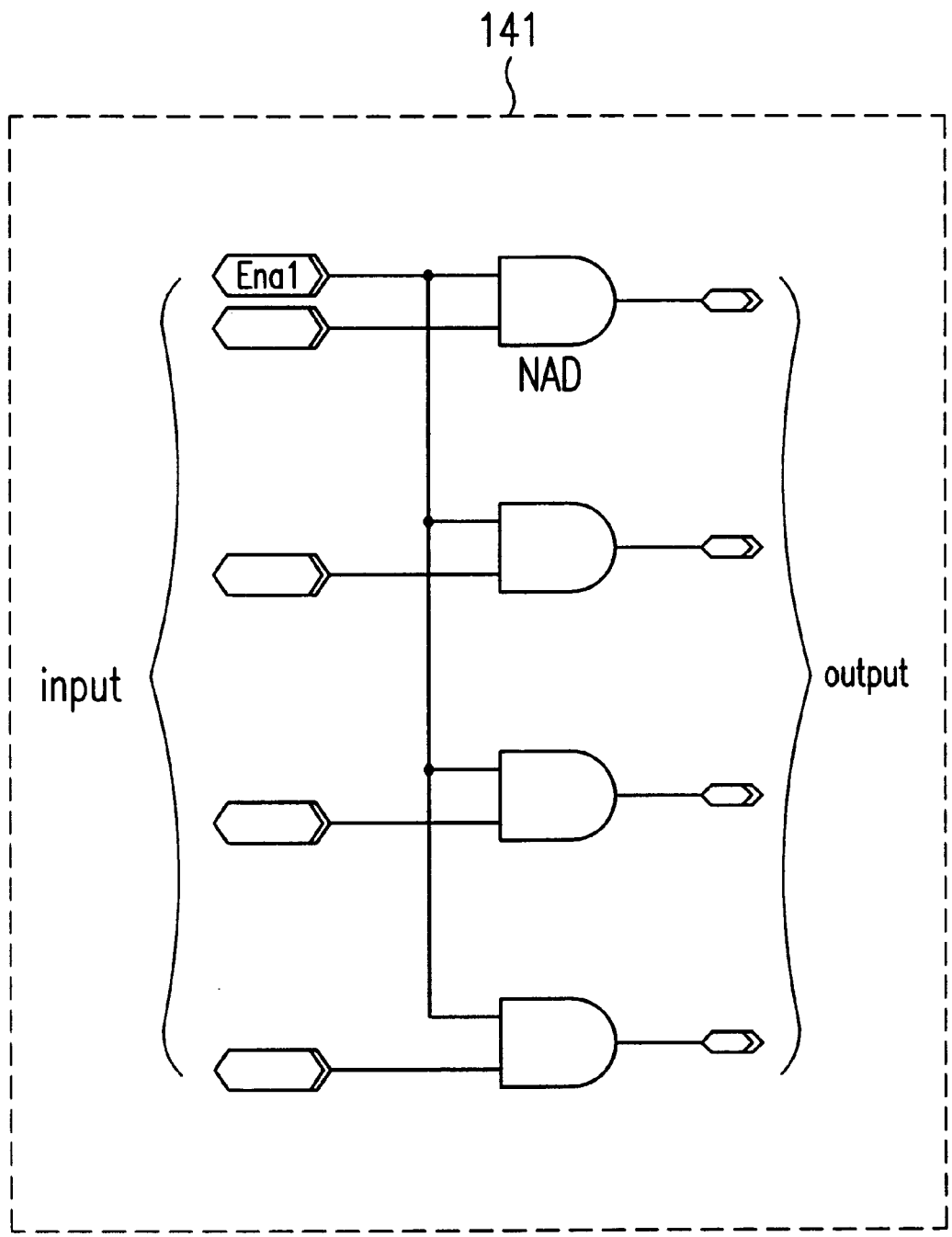
FIG. 16 is a detailed circuit diagram for the 4-bit gate shown in FIG. 13.

4-bit gate 141, as shown in FIG. 16, comprises 4 AND gates to output data in 4-bit format used for controlling the output time of data.

Figure 17:
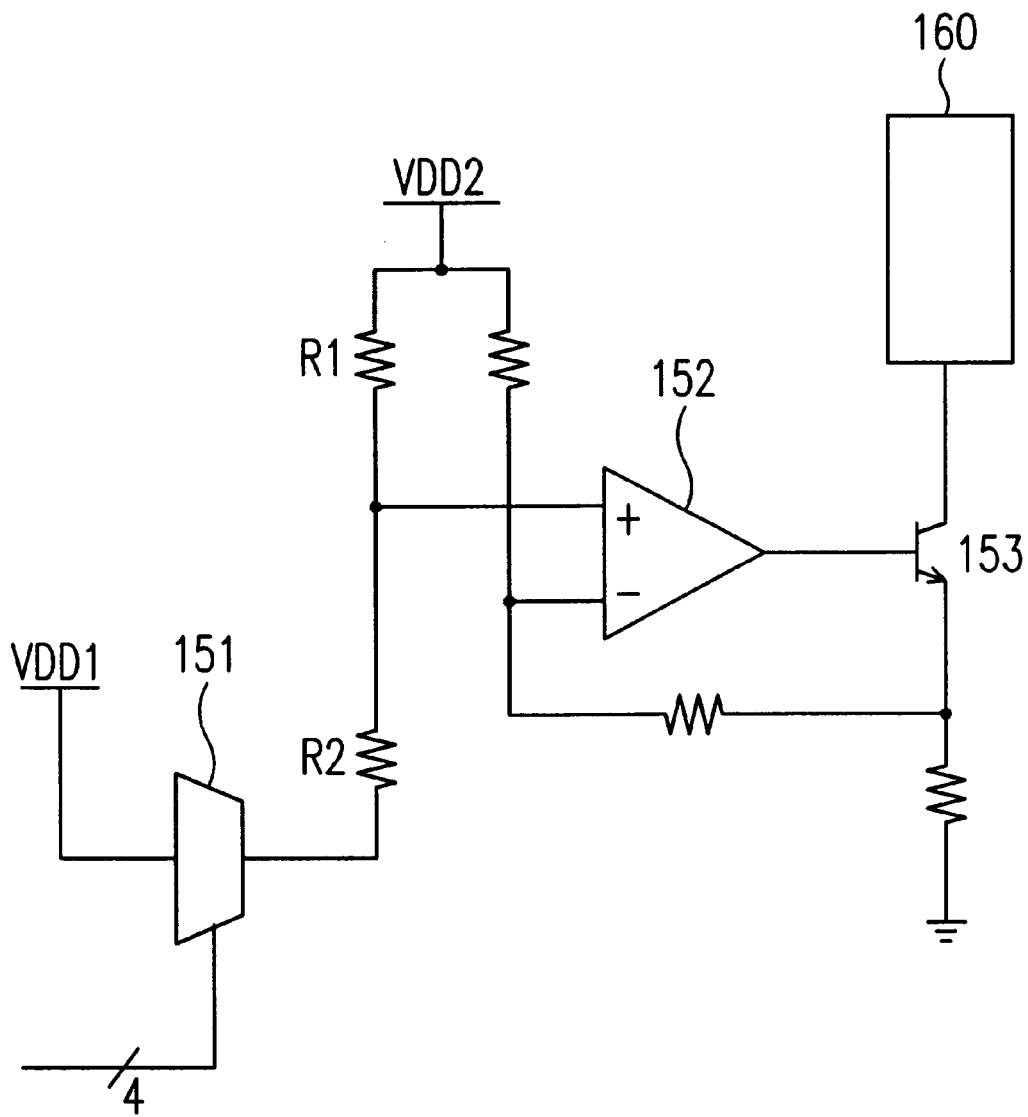
FIG. 17 is a detailed circuit diagram for the output driving circuit shown in FIG. 12.

FIG. 17 is a detailed view of output driving circuit 150. Output driving circuit 150 of FIG. 17 comprises of analog multiplexor 151 for inputting the digital signal received from voltage source VDD1 and the digitized signal received through 4-bit gate 141 to output the voltage corresponding to the signal; operational amplifier 152 for receiving the output signal from analog multiplexor 151 and comparing it with voltage from voltage source VDD2 to adjust the current gain of the transistor in the next stage according to the difference between the compared voltages; resistors R1 and R2 which are connected between the voltage source VDD2 and the non-inverting input terminal of OP-amp 152 and between the non-inverting input terminal and the output terminal of analog multiplexor 151, respectively, for serving as voltage dividers; and bipolar transistor 153 for adjusting the quantity of the electrons emitted from the cathode according to the current gain of OP-amp 152 to drive the electrons to display panel 160.

Figure 18:
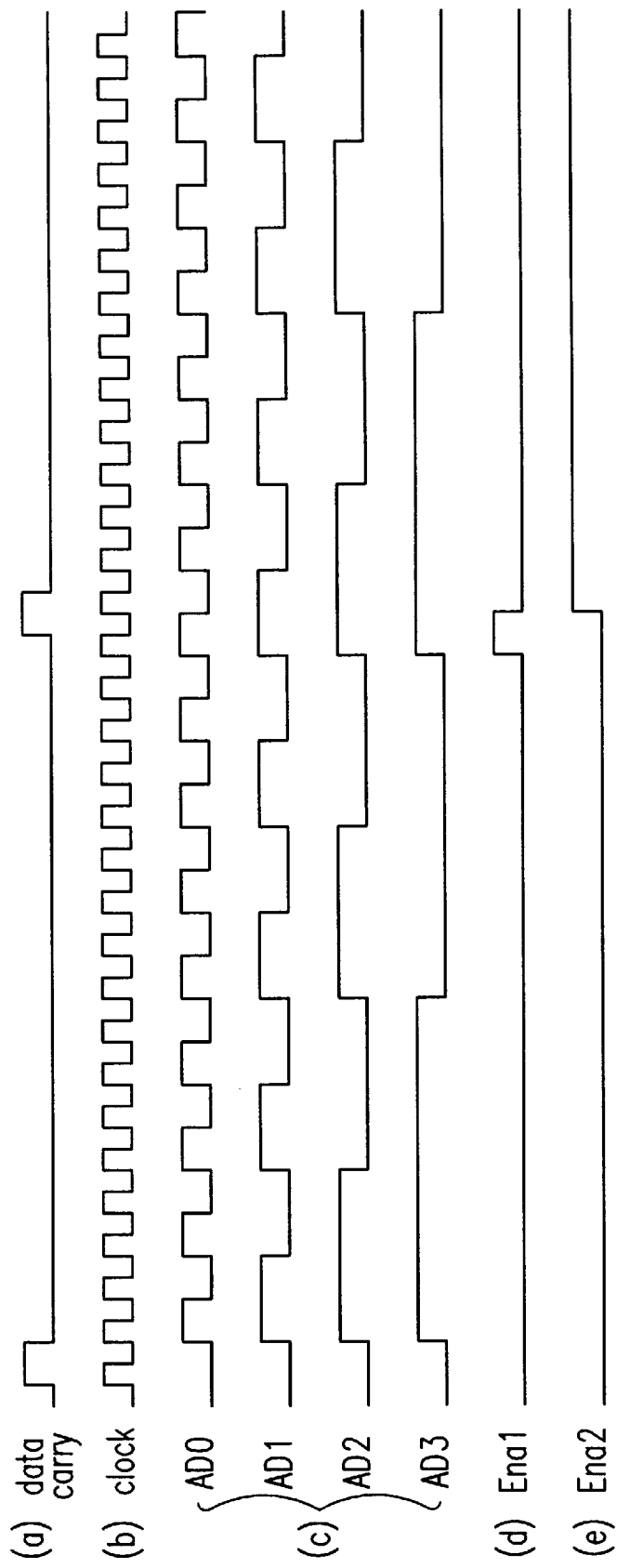
FIG. 18 is a timing diagram of the second embodiment of the present invention.

When a digitized signal is received through 4-bit gate 141, analog multiplexor 151 outputs voltage corresponding to the received signal, since the voltage corresponding to the gray level to be displayed on panel 160 is adjusted according to the number of the gradation level. Resistors R1 and R2 are used to adjust and drive the voltage received by OP-amp 152. Referring to the timing diagram of FIG. 18, the operation of the flat panel display according to the second embodiment of the present invention is described.

If a signal is received by the carry input terminal of shift register 110, the input data received in synchronization with the rising edge of the clock signal (as shown in FIG. 18*b*) for synchronization is phase-shifted sequentially according to the time and input of latch 120 which latches after the data and addresses AD0[0:3]–AD3[0:3] are synchronized and received.

Then, if second latch 131 receives the first enable signal, Ena1, in active state (as shown in FIG. 18*d*), the data output from each of the flip-flops 121 of latch 121 is received by second latches 131; thereby the second latching state is reached. Then, if the second enable signal, Ena2, which is received by AND gates 140 becomes active in response to the disable state of the first enable signal Ena1 (as shown in FIG. 18*e*), the data which was stored in each flip-flop of second latch 131 is inputted to each AND gate of AND gate 140.

The input data is received by output driving circuit 150 4-bit by 4-bit and displayed finally, wherein the data that was inputted into analog multiplexor 151 of output driving circuit 150 is output as voltage corresponding to the signal within analog multiplexor 151 as described above and the voltage was driven from the voltage source VDD1.

The output voltage from analog multiplexor 151 is compared with the supply voltage VDD2 driven to OP-amp 152 and divided by resistors R1 and R2. Then, the difference of voltage is inputted into one terminal of OP-amp 152 wherein the difference between the difference of voltage and the voltage inputted into the other input terminal of OP-amp 152 is amplified and driven to the gate terminal of bipolar transistor 153 which drives the final display panel. Thus, the gradation control of the display panel is simplified by using the turn-on state of bipolar transistor 153 according to the difference of voltage and the current flowing through it.

In other words, the current gain of bipolar transistor 153 is adjusted by the signal driven to the gates. Then, the current gain adjusts the quantity of electrons emitted from cathodes simplifying the gradation control of the display.

Figure 19:
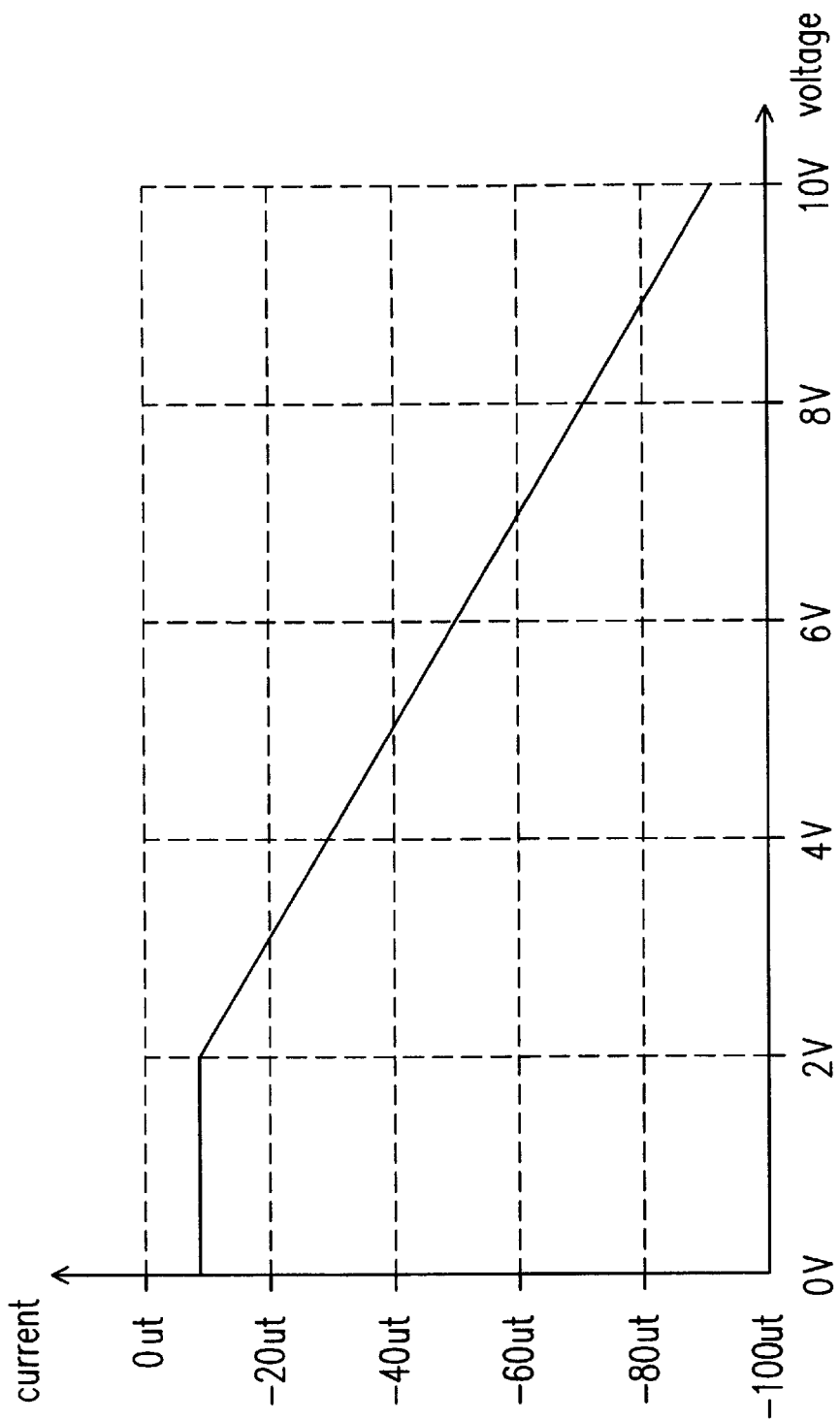
FIG. 19 is a graph showing the amount of change in current in connection to the explanation of the operation of the second embodiment of the present invention.

As shown in FIG. 19 which illustrates the current variation with respect to the signal received from analog multiplexor 151, the current increases linearly in response to the increase of the voltage.

Figure 20:
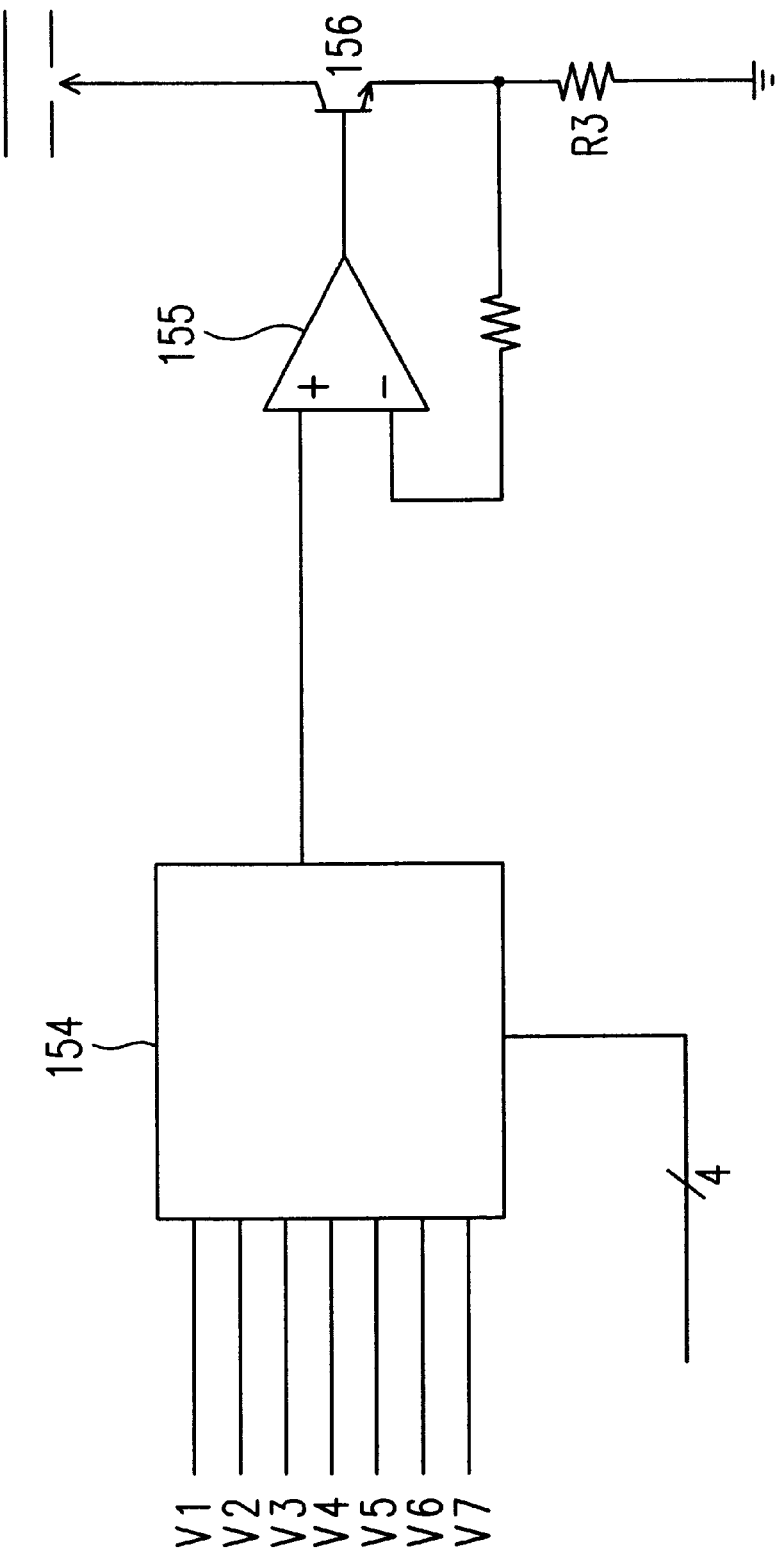
FIG. 20 is a circuit diagram representative of the alternative embodiment of an output driving circuit shown in FIG. 12.

FIG. 20 is a circuit diagram illustrating another embodiment of output driving circuit 150. Output driving circuit 150 of FIG. 20 comprises of analog multiplexor 154, which receives a plurality of voltage signals corresponding to the gradation of the display and selectively outputs a corresponding voltage signal when the digitized signal is received through the 4-bit output terminal; OP-amp 155 for amplifying the output voltage of analog multiplexor 154 to drive the amplified voltage to the transistor of the next stage; transistor 156 for driving display panel 160 according to the voltage received from OP-amp 155; and resistor R3 wherein one input terminal of resistor R3 is commonly connected to both the emitter terminal of transistor 156 and inverting terminal of OP-amp 155 and the other input terminal is grounded thereby making constant voltage be driven to the non-inverting terminal of the OP-amp and the ground terminal of transistor 156 even if the collector terminal of the transistor is floating.

In operation, when a digitized signal is received from AND gate 140, a voltage signal corresponding to the received digitized signal is output. Then, the plurality of voltage signals V1–V6 are driven to analog multiplexor 154 according to the gradation of the display wherein multiplexor 154 selects one voltage signal among the plurality.

The selected signal is inputted into a non-inverting terminal of OP-amp 155, amplified and input to the gate terminal of transistor 156. Resistor R3 connected to the emitter terminal of the transistor, provides for the floating of the collector terminal, feed-backs the current which flows through transistor 156 allowing a constant voltage to be driven between OP-amp 155 and transistor 156. Then, the voltage signal inputted into the gate terminal drives the image display via cathode.

According to the first embodiment of the present invention as described above, adjustment to the quantity of electrons emitted from the cells is simplified by using the current control scheme, thereby making a 16 level display gradation of panel possible. Also, the quantity of the emitted electrons may be adjusted to a value under uA by adjusting the resistor at the terminal stage of the cathode driving circuit.

According to the second embodiment of the present invention, the driving velocity is reduced by processing data signals in parallel using a plurality of 4-bit latches. Further, if 4-bit data are input serially in response to the time variation, the input clock rate is 4 times faster than the velocity of parallel processing.

However, the input clock rate may be reduced more than in serial processing by using external input signal AD[0:3] which was synchronized with the separate latch without using data of a shift register by a plurality of latches of the present invention.

Also, the gradation of display may be processed correctly if the display device is an electron emission tip display wherein the uniform tip is hard to obtain, by using an analog multiplexor which selectively varies the voltage of the input signal from the control logic circuit making the quantity control of the elections which flows through the current control circuit correct.

Also, electrons are emitted at correct time by correctly controlling the data output signal using the 4-bit gate stages of the driving control logic circuit according to the present invention.

The present invention is not limited to the embodiments described herein and modifications and variations are easily obtained within the scope and spirit of the present invention. Although the present invention is described by embodiments which receive 4-bit video data to process a 16 level gradation of display, the present invention may be applied to the 32, 64 or larger level gradations of display and to the FED driving circuit for VGA application.

The present invention has been described with reference to a particular embodiment in connection to a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. An apparatus for driving a flat panel display, comprising:

a shift register for sequentially shifting a video signal input from the exterior in synchronism with a clock signal, said shift register comprising n multiplexers for multiplexing a plurality of input signals in accordance with an up/down count instruction signal, and n D flip-flops for performing an arithmetic operation on an output signal from said multiplexers to output as an internal signal and for feeding back the internal signal to an input stage of a subsequent multiplexer, said shift register performing a bi-directional shifting;

a latch for temporarily storing and outputting said video signal which has been sequentially input from said shift register, said latch comprising a plurality of D-type latches responsive to each output signal from said shift register and a first enable signal for performing a latching operation;

an AND gate for adjusting a time of outputting said video signal output from said latch, said AND gate comprising a plurality of AND gates responsive to each output signal from said latch and a second enable signal for performing an AND operation; and an output driving circuit for inputting said video signal from said AND gate and performing a display gradation control, said output driving circuit comprising a plurality of NPN transistors connected between the lower end of a cathode and ground, a plurality of operational amplifiers each connected to a respective one of said plurality of NPN transistors for switching a corresponding transistor. and a plurality of resistors each connected to a respective one of said plurality of NPN transistors and the ground, each resistor having a resistance value different from other resistors.

2. An apparatus for driving a flat panel display, comprising:

a shift register for sequentially shifting data input from the exterior in a synchronized manner;

a plurality of latches for performing parallel processing of input data by latching the input data by using the signal output from said shift register as a synchronization signal, said plurality of latches allowing for a display in accordance with the output of data synchronized with a clock signal by inputting an output of a first latch stage into a second latch stare upon activation of a first enable signal, and inputting an output of the second latch stage into a 4-bit output stage upon activation of a second enable signal;

an AND gate for outputting the signal output through said plurality of latches on a bit by bit basis; and an output driving circuit for enabling a display gradation processing by controlling the amount of currents in accordance with the signal output from said AND gate, said output driving circuit receiving a single supply voltage and including, an analog multiplexer for inputting a digitized signal through said AND gate and outputting a voltage corresponding to said digitized signal;

an operational amplifier responsive to the signal output from said analog multiplexer for comparing the signal output from said analog multiplexer with a voltage applied from a power supply and adjusting the current gain of a transistor at a subsequent stage in accordance with a voltage difference from said comparison;

a voltage divider connected between the power supply and said operational amplifier and between said operational amplifier and an output stage of said analog multiplexer; and a transistor for controlling an amount of electrons emitted from a cathode in accordance with a current gain applied at said operational amplifier and for applying the controlled amount of electrons to a display panel.

3. An apparatus for driving a flat panel display, comprising:

a shift register for sequentially shifting data input from the exterior in a synchronized manner;

a plurality of latches for performing parallel processing of input data by latching the input data by using the signal output from said shift register as a synchronization signal, said plurality of latches allowing for a display in accordance with the output of data synchronized with a clock signal by inputting an output of a first latch stage into a second latch stage upon activation of a first enable signal, and inputting an output of the second latch stage into a 4-bit output stage upon activation of a second enable signal;

an AND gate for outputting the signal output through said plurality of latches on a bit by bit basis; and an output driving circuit for enabling a display gradation processing by controlling the amount of current in accordance with the signal output from said AND gate, said output driving circuit being supplied with a plurality of voltages corresponding to a display gradation processing and including, an analog multiplexer for selecting and outputting a corresponding voltage upon receiving a digitized signal through said AND gate;

an operational amplifier for inputting and amplifying a voltage output from said analog multiplexer, and for applying the amplified voltage to a subsequent transistor;

a transistor for driving a display panel in accordance with the voltage applied from said operational amplifier; and a resistor for maintaining a constant voltage between said operational amplifier and a ground of said transistor, a first end of said resistor being commonly connected to an emitter end of said transistor and said operational amplifier, and a second end of said resistor being connected to the ground.

* * * * *